(12) United States Patent
Ishizaki et al.

(10) Patent No.: US 9,966,367 B2
(45) Date of Patent: *May 8, 2018

(54) LIGHT EMITTING DEVICE

(71) Applicant: Sharp Kabushiki Kaisha, Osaka (JP)

(72) Inventors: Shinya Ishizaki, Osaka (JP); Makoto Agatani, Osaka (JP); Tomokazu Nada, Osaka (JP); Toshio Hata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/587,759

(22) Filed: May 5, 2017

(65) Prior Publication Data

US 2017/0243859 A1    Aug. 24, 2017

Related U.S. Application Data

(60) Division of application No. 15/187,945, filed on Jun. 21, 2016, now Pat. No. 9,679,942, which is a division (Continued)

(30) Foreign Application Priority Data

Jan. 22, 2010 (JP) ................. 2010-012486

(51) Int. Cl.
*H01L 33/00* (2010.01)
*H01L 25/075* (2006.01)
(Continued)

(52) U.S. Cl.
CPC .......... *H01L 25/0753* (2013.01); *F21K 9/232* (2016.08); *F21K 9/238* (2016.08);
(Continued)

(58) Field of Classification Search
None
See application file for complete search history.

(56) References Cited

U.S. PATENT DOCUMENTS 6,008,582 A    12/1999 Asano et al.
6,583,550 B2    6/2003 Iwasa et al.
(Continued)

FOREIGN PATENT DOCUMENTS

CN    1811265(A)    8/2006
CN    1909238 A    2/2007
(Continued)

OTHER PUBLICATIONS

U.S. Appl. No. 15/187,945, filed Jun. 21, 2016; Ishizaki et al.
(Continued)

*Primary Examiner* — Minh-Loan Tran
(74) *Attorney, Agent, or Firm* — Nixon & Vanderhye P.C.

(57) ABSTRACT

A light emitting device includes: a ceramic substrate; a plurality of LED chips; a printed resistor(s) connected in parallel with the plurality of LED chips; a dam resin made of a resin having a low optical transmittance; a fluorescent-material-containing resin layer; and an anode-side electrode and a cathode-side electrode, (a) which are provided on a primary surface of the ceramic substrate so as to face each other along a first direction on the primary surface and (b) which are disposed below at least one of the dam resin and the fluorescent-material-containing resin layer. With the configuration in which a plurality of LEDs, which are connected in a series-parallel connection, are provided on a substrate, it is possible to provide a light emitting device which can achieve restraining of luminance unevenness and an improvement in luminous efficiency.

14 Claims, 12 Drawing Sheets

Related U.S. Application Data of application No. 14/674,624, filed on Mar. 31, 2015, now Pat. No. 9,425,236, which is a division of application No. 14/217,701, filed on Mar. 18, 2014, now Pat. No. 9,093,357, which is a division of application No. 13/799,373, filed on Mar. 13, 2013, now Pat. No. 8,723,195, which is a continuation of application No. 13/011,124, filed on Jan. 21, 2011, now Pat. No. 8,421,094.

(51) Int. Cl.

| | | |
|---|---|---|
| *H01L 33/48* | (2010.01) | |
| *H01L 33/54* | (2010.01) | |
| *H01L 33/56* | (2010.01) | |
| *H01L 33/38* | (2010.01) | |
| *H01L 33/62* | (2010.01) | |
| *H01L 33/50* | (2010.01) | |
| *F21K 9/238* | (2016.01) | |
| *F21K 9/232* | (2016.01) | |
| *F21V 23/00* | (2015.01) | |
| *H01L 33/52* | (2010.01) | |
| *H01L 33/60* | (2010.01) | |
| *F21V 29/74* | (2015.01) | |
| *F21Y 105/10* | (2016.01) | |
| *F21Y 115/10* | (2016.01) | |

(52) U.S. Cl.
CPC .......... *F21V 23/005* (2013.01); *H01L 33/38* (2013.01); *H01L 33/483* (2013.01); *H01L 33/486* (2013.01); *H01L 33/507* (2013.01); *H01L 33/52* (2013.01); *H01L 33/54* (2013.01); *H01L 33/56* (2013.01); *H01L 33/60* (2013.01); *H01L 33/62* (2013.01); *F21V 29/74* (2015.01); *F21Y 2105/10* (2016.08); *F21Y 2115/10* (2016.08)

(56) References Cited

U.S. PATENT DOCUMENTS

| | | | |
|---|---|---|---|
| 6,942,360 | B2 | 9/2005 | Chou et al. |
| 7,675,075 | B2 | 3/2010 | Nagai |
| 8,049,237 | B2 | 11/2011 | Yamada et al. |
| 8,421,094 | B2 | 4/2013 | Ishizaki et al. |
| 8,723,195 | B2 | 5/2014 | Ishizaki et al. |
| 9,093,357 | B2 * | 7/2015 | Ishizaki .................. F21V 3/00 |
| 9,425,236 | B2 | 8/2016 | Ishizaki et al. |
| 9,679,942 | B2 | 6/2017 | Ishizaki et al. |
| 2004/0079957 | A1 | 4/2004 | Andrews et al. |
| 2004/0113267 | A1 | 6/2004 | Yogo et al. |
| 2006/0049423 | A1 | 3/2006 | Yamaguchi et al. |
| 2007/0030611 | A1 | 2/2007 | Cho et al. |
| 2007/0041185 | A1 | 2/2007 | Yatsuda et al. |
| 2007/0103939 | A1 | 5/2007 | Huang et al. |
| 2007/0194422 | A1 | 8/2007 | Lai et al. |
| 2008/0007939 | A1 | 1/2008 | Lee et al. |
| 2008/0128739 | A1 | 6/2008 | Sanpei et al. |
| 2008/0224608 | A1 | 9/2008 | Konishi et al. |
| 2008/0231169 | A1 | 9/2008 | Hata et al. |
| 2008/0316742 | A1 | 12/2008 | Zhou |
| 2009/0046456 | A1 | 2/2009 | Urano et al. |
| 2009/0050907 | A1 | 2/2009 | Yuan et al. |
| 2009/0050908 | A1 | 2/2009 | Yuan et al. |
| 2009/0108271 | A1 | 4/2009 | Chou et al. |
| 2009/0108281 | A1 | 4/2009 | Keller et al. |
| 2009/0141492 | A1 | 6/2009 | Fujino et al. |
| 2009/0166657 | A1 | 7/2009 | Jamada et al. |
| 2009/0267099 | A1 | 10/2009 | Sakai |
| 2009/0268450 | A1 | 10/2009 | Kojoh et al. |
| 2009/0290346 | A1 | 11/2009 | Ogawa et al. |
| 2009/0296414 | A1 | 12/2009 | Moriyama et al. |
| 2009/0315057 | A1 | 12/2009 | Konishi et al. |
| 2010/0084683 | A1 | 4/2010 | Lai et al. |
| 2010/0252851 | A1 | 10/2010 | Emerson et al. |
| 2010/0301731 | A1 | 12/2010 | Morikawa et al. |
| 2010/0320483 | A1 | 12/2010 | Kadotani et al. |
| 2011/0001156 | A1 | 1/2011 | Matsuda et al. |
| 2011/0050071 | A1 | 3/2011 | Chung et al. |
| 2011/0316011 | A1 | 12/2011 | Ito et al. |
| 2012/0007112 | A1 | 1/2012 | Jamada et al. |
| 2012/0187862 | A1 | 7/2012 | Britt et al. |
| 2013/0092960 | A1 | 4/2013 | Wilcox et al. |
| 2013/0256710 | A1 | 10/2013 | Andrews et al. |
| 2013/0270581 | A1 | 10/2013 | Lowes et al. |
| 2015/0041835 | A1 | 2/2015 | Agatani |

FOREIGN PATENT DOCUMENTS

| | | |
|---|---|---|
| CN | 101944565 A | 1/2011 |
| CN | 102334201 A | 1/2012 |
| JP | 53-78048 | 7/1978 |
| JP | 56-084368 U | 7/1981 |
| JP | 59-18454 | 2/1984 |
| JP | 60-179057 U | 11/1985 |
| JP | 62-172164 | 10/1987 |
| JP | 05-029665 | 2/1993 |
| JP | 5-45812 | 6/1993 |
| JP | 06-318732 | 11/1994 |
| JP | 7-122786 | 5/1995 |
| JP | 07-273371 A | 10/1995 |
| JP | 10-98244 | 4/1998 |
| JP | 63-180957 | 11/1998 |
| JP | 11-191634 | 7/1999 |
| JP | 11-298041 | 10/1999 |
| JP | 11-307815 | 11/1999 |
| JP | 2001-237462 | 8/2001 |
| JP | 2001-351404 | 12/2001 |
| JP | 2002-094121 | 3/2002 |
| JP | 2002-299801 | 10/2002 |
| JP | 2002-304903 | 10/2002 |
| JP | 2002-308645 | 10/2002 |
| JP | 2002-312892 | 10/2002 |
| JP | 2003-218397 | 7/2003 |
| JP | 2003-273406 | 9/2003 |
| JP | 2003-318449 | 11/2003 |
| JP | 2004-87812 | 3/2004 |
| JP | 2006-080383 | 3/2006 |
| JP | 2006-093697 A | 4/2006 |
| JP | 2006-93697 A | 4/2006 |
| JP | 2007-043046 A | 2/2007 |
| JP | 2007-509505 | 4/2007 |
| JP | 2007-116095 | 5/2007 |
| JP | 2007-123789 | 5/2007 |
| JP | 2007-201171 | 8/2007 |
| JP | 2007-227882 | 9/2007 |
| JP | 2007-250899 A | 9/2007 |
| JP | 2007-294547 | 11/2007 |
| JP | 2007-311398 | 11/2007 |
| JP | 2007-324205 A | 12/2007 |
| JP | 2007-332009 | 12/2007 |
| JP | 2008-004844 | 1/2008 |
| JP | 2008-021650 | 1/2008 |
| JP | 2008-41290 | 2/2008 |
| JP | 2008-047851 | 2/2008 |
| JP | 2008-060129 | 3/2008 |
| JP | 2008-084943 | 4/2008 |
| JP | 2008-85109 A | 4/2008 |
| JP | 2008-235680 A | 10/2008 |
| JP | 2008-235719 | 10/2008 |
| JP | 2008-235824 A | 10/2008 |
| JP | 2009-040884 | 2/2009 |
| JP | 2009-059883 | 3/2009 |
| JP | 2009-76576 | 4/2009 |
| JP | 2009-088190 | 4/2009 |
| JP | 2009-111395 | 5/2009 |
| JP | 2009-135485 A | 6/2009 |
| JP | 2009-158872 | 7/2009 |
| JP | 2009-164157 A | 7/2009 |
| JP | 2009-206383 | 9/2009 |
| JP | 2009-231027 | 10/2009 |
| JP | 2009-231148 A | 10/2009 |

(56) References Cited

FOREIGN PATENT DOCUMENTS

| JP | 2009-290244 | 12/2009 |
|---|---|---|
| JP | 3156708 | 12/2009 |
| JP | 3156826 | 12/2009 |
| JP | 2010-003674 | 1/2010 |
| JP | 2011-009298 | 1/2011 |
| JP | 2011-014878 | 1/2011 |
| JP | 2011-049516 A | 3/2011 |
| WO | WO 2005/043627 | 5/2005 |
| WO | WO 2007/061033 | 5/2007 |
| WO | WO 2008/069204 | 6/2008 |
| WO | WO 2008/091837 | 7/2008 |
| WO | WO 2009/146257 | 12/2009 |

OTHER PUBLICATIONS

U.S. Appl. No. 14/674,624, filed Mar. 31, 2015; Ishizaki et al.
Office Action for U.S. Appl. No. 14/674,624 dated Dec. 9, 2015; Ishizaki et al.
Office Action for U.S. Appl. No. 14/663,696 dated Apr. 24, 2015; Agatani.
Office Action for U.S. Appl. No. 14/627,239 dated Aug. 28, 2015; Ishizaki.
"Final" Office Action for U.S. Appl. No. 13/799,373 dated Sep. 30, 2013; Ishizaki.
Office Action for U.S. Appl. No. 13/799,373 dated Jun. 21, 2013; Ishizaki.
Japanese Office Action for JP 2013-165596 dated Sep. 9, 2014.
Office Action dated Aug. 21, 2014 for U.S. Appl. No. 12/942,327, filed Nov. 9, 2010; Agatani.
U.S. Appl. No. 14/217,701, filed Mar. 18, 2014; Ishizaki et al.
U.S. Appl. No. 14/627,239, filed Feb. 20, 2015; Ishizaki et al.
Office Action for JP 2009-157133 dated Dec. 9, 2014.
U.S. Appl. No. 13/799,373, filed Mar. 13, 2013; Ishizaki et al.
Advisory Action for U.S. Appl. No. 12/942,327 dated Jan. 3, 2014; Agatani.
Office Action for JP 2009-157133 dated Nov. 26, 2013.
"Final" Office Action for U.S. Appl. No. 12/942,327 dated Oct. 18, 2013; Agatani.
U.S. Office Action dated Jun. 10, 2013 in U.S. Appl. No. 12/942,327.
Japanese Office Action and English translation thereof dated Jun. 18, 2013 in Japanese Patent Application 2010-012486.
Japanese Office Action dated May 28, 2013 in Japanese Patent Application 2009-157133.
Japanese Office Action and English translation dated May 28, 2013 in Japanese Patent Application 2009-157133.
U.S. Office Action dated Mar. 21, 2012 in U.S. Appl. No. 12/827,319.
Office Action for U.S. Appl. No. 14/957,268 dated Aug. 10, 2016; Agatani.
Office Action for JP 2014-35877 dated Sep. 27, 2016.
Office Action and Translation of JP 2014-035877 dated Jun. 28, 2016.

\* cited by examiner

If one LED chip in a group in a row is open-defective, for example, the other 2 LED chips in the same group in the row do not emit light. However, remaining 8 LED chips in the other groups in the row still emit light.

If one LED chip is open-defective in a row, for example, the other 10 LED chips in the row do not emit light.

LIGHT EMITTING DEVICE

This application is a divisional of U.S. patent application Ser. No. 15/187,945, filed Jun. 21, 2016, which is a divisional of U.S. patent application Ser. No. 14/674,624 filed Mar. 31, 2015 (now U.S. Pat. No. 9,425,236), which is a divisional of U.S. patent application Ser. No. 14/217,701 filed Mar. 18, 2014 (now U.S. Pat. No. 9,093,357), which is a divisional of Ser. No. 13/799,373 filed Mar. 13, 2013 (now U.S. Pat. No. 8,723,195), which is a continuation of U.S. patent application Ser. No. 13/011,124 filed Jan. 21, 2011 know U.S. Pat. No. 8,421,094), which is a nonprovisional application which claims priority under 35 U. S. C. § 119 (a) on Japanese Patent Application No. 2010-012486 filed in Japan on Jan. 22, 2010, the entire contents of which are all hereby incorporated by reference.

This is a continuation of U.S. patent application Ser. No. 13/011,124 filed Jan. 21, 2011, which is a nonprovisional application which claims priority under 35 U.S.C. § 119(a) on Patent Application No. 2010-012486 filed in Japan on Jan. 22, 2010, the entire contents of which are hereby incorporated by reference.

TECHNICAL FIELD

The present invention relates to a light emitting device including a plurality of light emitting elements provided in a series-parallel connection, and a protective element(s), which is electrically connected to the plurality of light emitting elements. Particularly, the present invention relates to a technique to restrain luminance unevenness and to improve luminous efficiency.

BACKGROUND ART

As an improvement in luminous efficiency becomes more important in recent years, LEDs (Light Emitting Diode) are being widely used in backlights provided in a display device and lighting apparatuses as a light source that saves more energy than electric bulbs or fluorescent lamps. For these purposes, energy efficiency is very important.

However, LEDs, especially, gallium nitride LEDs are easily broken due to electrostatic discharges. That is, the LEDs withstand only a small reverse voltage. In order to prevent such a problem, there has been disclosed a technique in which Zener diodes are connected to LEDs in an inverse-parallel connection (see Patent Literature 1, for example).

In such a configuration that employs the Zener diodes, when an excessive voltage is applied in a forward direction, an excessive current is bypassed due to Zener breakdown. In the meantime, when an excessive voltage is applied in a reverse direction, the Zener diodes serve as normal forward diodes to bypass an excessive current. In this way, the LEDs are protected from the excessive voltage in either direction. Further, a forward voltage to be applied to the LEDs is smaller than a Zener breakdown voltage of the Zener diodes. Even if the forward voltage is applied to the LEDs, no current flows into the Zener diodes, thereby resulting in that no energy loss occurs.

As another technique to prevent the above problem, there has been disclosed a technique in which resistors are connected to respective LEDs in parallel (see Patent Literatures 2 and 3, for example).

FIG. 13 illustrates a circuit configuration of an LED combination lamp 1000 described in Patent Literature 2. The LED combination lamp 1000 is configured such that a plurality of LEDs 1100 connected in series are connected to respective resistors (Rb) 1200 in parallel. With the configuration, even in a case where a given LED 1100 is disconnected, a corresponding resistor 1200 works as a bypass resistor, thereby making it possible to prevent that the other LEDs 1100 are turned off. Further, the configuration makes it possible to prevent deterioration of the LEDs 1100.

However, in order that the bypass resistor carries out its purpose, it is necessary to supply, to the bypass resistor, a current sufficient to turn on the other LEDs 1100 that are not disconnected. In view of this, it is necessary to use, as the resistors 1200, resistors having a low resistance. This arises such a problem that the current flowing through the bypass resistor causes large energy loss.

Further, Patent Literature 3 discloses a semiconductor light emitting device in which a plurality of LEDs are connected to respective variable resistors in parallel or in series so that respective currents flowing through the plurality of LEDs are adjustable. The semiconductor light emitting device also has such a problem that large energy loss occurs because an electric resistance of the variable resistors should be low.

Patent Literature 4 discloses, as an exemplary format ion of resistors to be connected to LEDs, an LED array in which a plurality of LEDs are connected in series to respective thick-film resistive elements.

CITATION LIST

Patent Literature 1
Japanese Patent Application Publication, Tokukaihei, No. 11-298041 A (Publication Date: Oct. 29, 1999)
Patent Literature 2
Japanese Patent Application Publication, Tokukaihei, No. 11-307815 A (Publication Date: Nov. 5, 1999)
Patent Literature 3
Japanese Patent Application Publication, Tokukai, No. 2007-294547 A (Publication Date: Nov. 8, 2007)
Patent Literature 4
Japanese Utility Model Application Publication, Jitsukaisho, No. 63-180957 U (Publication Date: Nov. 22, 1988)

SUMMARY OF INVENTION

Technical Problem

Inventors of the present invention found the following fact: In a case where a plurality of LEDs connected in a series-parallel connection are provided on a substrate to achieve light emission with high luminance and high output; electrode wiring patterns are deposited between adjoining LEDs so as to electrically connect the adjoining LEDs. This causes such problems that luminance becomes uneven and that luminous efficiency is decreased due to absorption of light by the electrode wiring patterns.

However, Patent Literatures 1 to 4 do not describe anything about such problems and means for solving the problems.

Further, the configurations disclosed in Patent Literatures 1 to 3 which employ Zener diodes or resistors arise the following problems.

In a case where Zener diodes are used, in order to minimize the influence of disconnection on a package in which a plurality of LEDs connected in series are to be mounted, a largest possible number of Zener diodes should be connected. This arises problems that the package becomes large in size and that a process of mounting the Zener diodes is additionally required.

In the meantime, in order that the Zener diodes are wire-bonded, it is necessary to dispose the Zener diodes in vicinity to LEDs and within an area where sealing resin for sealing the LEDs is provided. However, such a configuration is not preferable because luminance (light output) may be decreased due to light absorption by the Zener diodes. Besides, such a configuration that the Zener diode are provided within the area where the sealing resin is provided makes it difficult to provide the LEDs in the center.

As such, Zener diodes have a large disadvantage for mounting of LEDs in a package. Further, there are such problems that the production of the Zener diodes is not easy as compared with the production of resistors, and that the Zener diodes has long-term reliability lower than that of the resistors.

However, even in the configuration that uses resistors, light absorption by the resistors is caused. Further, in a case where the resistors are disposed in an area where no sealing resin is provided, so as to prevent the light absorption by the resistors, a package should be unfavorably enlarged in size. In addition, relatively large resistors and thick-film resistive elements have limitations on an area in which to dispose the resistors and the thick-film resistive elements.

The present invention is accomplished in view of the above conventional problems. An object of the present invention is to provide a light emitting device in which a plurality of LEDs, which are connected in a series-parallel connection, are provided on a substrate, and which can restrain luminance unevenness and improve luminous efficiency. Further, another object of the present invention is to provide a light emitting device in which a protective element(s) as provided at a portion in the light emitting device that minimizes light absorption, thereby further improving luminous efficiency.

Solution to Problem

In order to achieve the above object, a light emitting device of the present invention includes: a substrate; a plurality of light emitting elements provided on a primary surface of the substrate; at least one protective element connected in parallel with the plurality of light emitting element; a resin frame made of a resin having a low optical transmittance, the resin frame being provided annularly on the primary surface of the substrate so as to surround a mounting area in which the plurality of light emitting elements are provided; a fluorescent-material-containing resin layer made of a resin containing fluorescent materials, the fluorescent-material-containing resin layer being provided adjacent to an inner side of the resin frame so as to cover the plurality of light emitting elements; and at least one first light emitting element connection electrode and at least one second light emitting element connection electrode, which are provided on the primary surface of the substrate so as to face each other along a first direction in the primary surface, the plurality of light emitting elements having such a circuit configuration that at least two series circuit sections, in each of which at least two of the plurality of light emitting elements are connected in series, are connected in parallel between the at least one first light emitting element connection electrode and the at least one second light emitting element connection electrode, the at least two series circuit sections being aligned along a second direction orthogonal to the first direction in the primary surface, between the at least one first light emitting element connection electrode and the at least one second light emitting element connection electrode, the at least two of the plurality of light emitting elements in each of the at least two series circuit sections being aligned along the first direction, the at least one first light emitting element connection electrode and the at least one second light emitting element connection electrode being disposed below at least one of the resin frame and the fluorescent-material-containing resin layer.

In the above configuration, the first light emitting element connection electrode and the second light emitting element connection electrode are disposed so as to sandwich a mounting area where the light emitting elements are provided. Further, the light emitting elements in a series circuit section are directly wire-bonded, for example, so as to be electrically connected to each other. Accordingly, it is unnecessary to provide conventionally used electrode wiring patterns. This configuration reduces distances between the light emitting elements, thereby increasing a packaging density of the light emitting elements. Consequently, it is advantageously possible to restrain that light emitted from the light emitting elements appears bright dots and to restrain in-plane luminance unevenness of the light emitting device. Furthermore, it is also advantageously possible to downsize the light emitting device.

Further, when largest possible parts of the first light emitting element connection electrode and the second light emitting element connection electrode are disposed below the resin frame, light absorption by these electrodes can be restrained. In addition to this, light absorption by the electrode wiring patterns is also reduced. This accordingly makes it possible to improve the luminous efficiency. Further, since the protective element is connected in parallel with the light emitting elements, it is possible to prevent deterioration of the light emitting elements, thereby allowing the light emitting device to be used for a longer term and ensuring its reliability. As a result, it is possible to provide a light emitting device having excellent luminous efficiency and excellent reliability.

Advantageous Effects of Invention

As described above, the light emitting device of the present invention includes: a substrate; a plurality of light emitting elements provided on a primary surface of the substrate; at least one protective element connected in parallel with the plurality of light emitting element; a resin frame made of a resin having a low optical transmittance, the resin frame being provided annularly on the primary surface of the substrate so as to surround a mounting area in which the plurality of light emitting elements are provided; a fluorescent-material-containing resin layer made of a resin containing fluorescent materials, the fluorescent-material-containing resin layer being provided adjacent to an inner side of the resin frame so as to cover the plurality of light emitting elements; and at lease one first light emitting element connection electrode and at least one second light emitting element connection electrode, which are provided on the primary surface of the substrate so as to face each other along a first direction in the primary surface. The light emitting device of the present invention is configured such that (i) the plurality of light emitting elements has such a circuit configuration that at least two series circuit sections, in each of which at least two of the plurality of light emitting elements are connected in series, are connected in parallel between the at least one first light emitting element connection electrode and the at least one second light emitting element connection electrode, (ii) the at least two series circuit sections are aligned along a second direction orthogonal to the first direction in the primary surface, between the at least one first light emitting element connection electrode and the at least one second light emitting element connection electrode, (iii) the at least two of the plurality of light emitting elements in each of the at least two series circuit sections are aligned along the first direction, and (iv) the at least one first light emitting element connection electrode and the at least one second light emitting element connection electrode are disposed below at least one of the resin frame and the fluorescent-material-containing resin layer.

In the above configuration, the first light emitting element connection electrode and the second light emitting element connection electrode are disposed so as to sandwich a mounting area where the light emitting elements are provided. Further, the light emitting elements in a series circuit section are directly wire-bonded, for example, so as to be electrically connected to each other. Accordingly, it is unnecessary to provide conventionally used electrode wiring patterns. This configuration reduces distances between the light emitting elements, thereby increasing a packaging density of the light emitting elements. Consequently, it is advantageously possible to restrain that light emitted from the light emitting elements appears bright dots and to restrain in-plane luminance unevenness of the light emitting device. Furthermore, it is also advantageously possible to downsize the light emitting device.

Further, when largest possible parts of the first light emitting element connection electrode and the second light emitting element connection electrode are disposed below the resin frame, light absorption by these electrodes can be restrained. In addition to this, light absorption by the electrode wiring patterns is also reduced. This accordingly makes it possible to improve the luminous efficiency. Further, since the protective element is connected in parallel with the light emitting elements, it is possible to prevent deterioration of the light emitting elements, thereby allowing the light emitting device to be used for a longer term and ensuring its reliability. As a result, it is possible to provide a light emitting device having excellent luminous efficiency and excellent reliability.

DESCRIPTION OF EMBODIMENTS

Embodiment 1

The following describes one embodiment of the present invention with reference to drawings. Initially explained is an entire configuration of a light emitting device, briefly. Then, characteristic configurations, a production method, and the like of the light emitting device will be explained in order.

(Entire Configuration)

Figure 1:
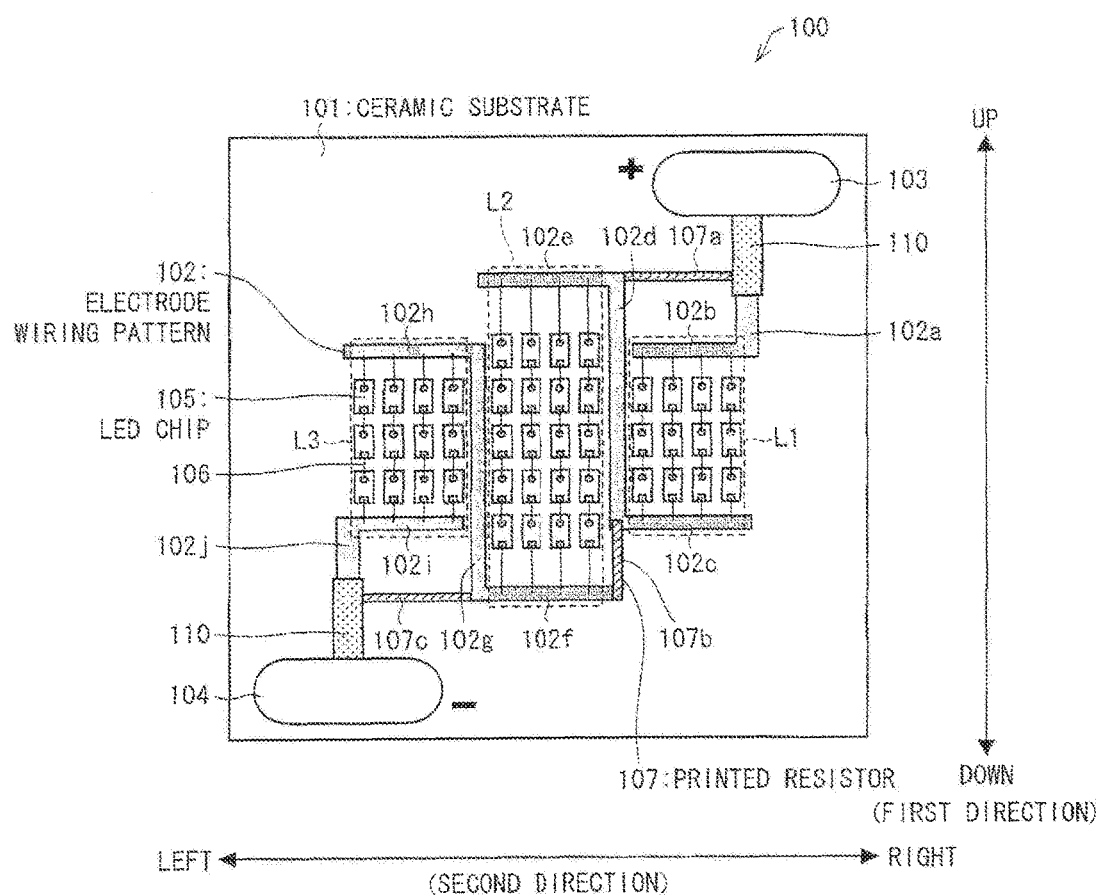
FIG. 1 is a top view illustrating a light emitting device (without sealing resin) according to Embodiment 1 of the present invention.
Figure 2:
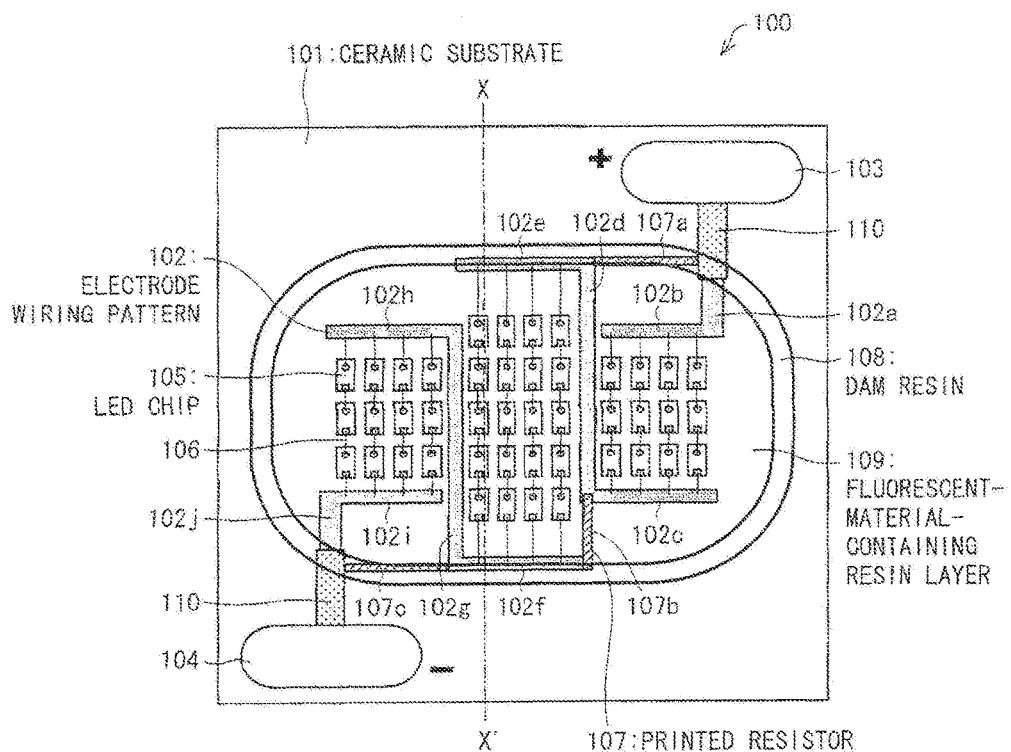
FIG. 2 is a top view illustrating the light emitting, device (finished product) according to Embodiment 1 of the present invention.
Figure 3:
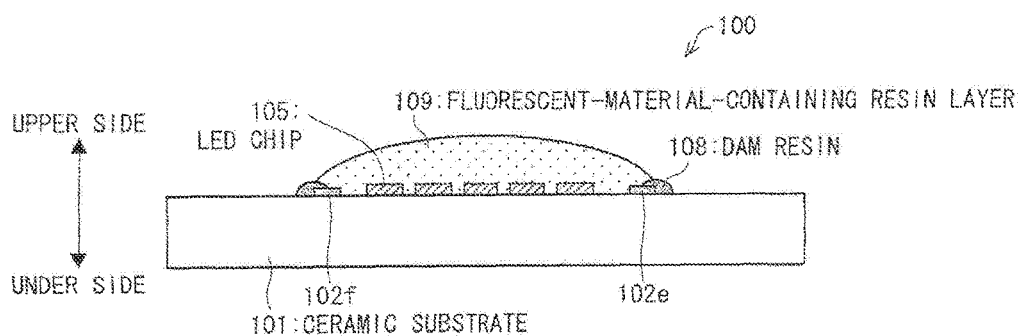
FIG. 3 is a cross-sectional view of the light emitting device taken along the line X-X' of FIG. 2.

FIG. 1 is a top view illustrating one exemplary configuration of a light emitting device 100 according to the present embodiment. More specifically, FIG. 1 illustrates the light emitting device 100 in which LED chips 105 and the like are provided on a primary surface of a ceramic substrate 101 but they have not been resin-molded yet. FIG. 2 is a top view illustrating one exemplary configuration of the light emitting device 100 of the present embodiment. More specifically. FIG. 2 illustrates the light emitting device 100 as a finished package in which the LED chips 105 and the like provided on the primary surface of the ceramic substrate 101 are resin-molded. Note that the resin mold (a fluorescent-material-containing resin layer 109, which will be described later) contains fluorescent materials so that the resin mold is colored and absorbs light. In view of this, light does not pass through the resin mold and therefore the primary surface of the ceramic substrate, on which the LED chips 105 are provided, is not observable. Further, the after-mentioned dam resin 108 (resin frame) has a low optical transmittance, so that a portion, on the primary surface, that is below the dam resin 108 is not observable from above. FIG. 2 illustrates, through these opaque members, a mounting surface on which the LED chips 105 are provided, so that the mounting surface is clearly observed. Drawings (FIG. 5 to FIG. 10) for the after-mentioned embodiments illustrate light emitting devices in the same manner. FIG. 3 is a cross-sectional view of the light emitting device 100 taken along the line X-X' of FIG. 2.

In the following description, a vertical direction in FIG. 1 and FIG. 2 is referred to as a vertical direction (up-and-down direction/first direction) of the primary surface, and a horizontal direction in FIG. 1 and FIG. 2 is referred to as a horizontal direction (left-to-right direction/second direction) of the primary surface. Further, an upper side in FIG. 3 is referred to as an upper side of the light emitting device 100, and an under side in FIG. 3 is referred to as an under side of the light emitting device 100. Further, a view illustrating the primary surface of the ceramic substrate 101 vertically viewed from above, e.g., the views of FIG. 1 and FIG. 2, is called top view (planar view).

As illustrated in FIG. 1 to FIG. 3, the light emitting device 100 of the present embodiment includes a ceramic substrate 101 (substrate), LED chips 105 (light emitting elements), wires 106 (metal wires), printed resistors 107 (protective elements), a dam resin 108 (resin frame), and a fluorescent-material-containing resin layer 109.

The ceramic substrate 101 is a substrate made of ceramic. The ceramic substrate 101 has a rectangular outer shape in the top view. There are provided, on a primary surface of the ceramic substrate 101, the LED chips 105, the wire a 106, the printed resistors 107, a the dam resin 108, and the fluorescent-material-containing resin layer 109. Further, on the primary surface of the ceramic substrate 101 are also provided an electrode wiring pattern 102, an anode-side electrode land 103, and a cathode-side electrode land 104.

The LED chips 105 are blue LEDs having an emission peak wavelength of 450 nm, but are not limited to this. The LED chips 105 may be, for example, ultraviolet (near-ultraviolet) LED chips having an emission peak wavelength of 390 nm to 420 nm. In this case, it is possible to further improve luminous efficiency. A plurality (44 pieces in the present embodiment) of the LED chips 105 are fixed on the primary surface of the ceramic substrate 101 via a silicone resin adhesive agent. The LED chips 105 each have a rectangular outer shape in the top view. Each of the LED chips 105 is provided with an anode electrode and a cathode electrode (hereinafter, they may be collectively called "chip electrode") on its surface such that they are opposite one another in a longitudinal direction. The LED chips 105 are wire-bonded via the wires 106 so as to be electrically connected to each other. The wires 106 are made of gold, for example.

The printed resistors 107 are thin-film resistive elements which are thinner than the LED chips 105 in thickness and which are formed in such a manner that printed paste resistor components are sintered to be fixed. The printed resistors 107 are made of ruthenium oxide ($RuO_2$). The printed resistors 107 are partially formed on the primary surface of the ceramic substrate 101 so as to be connected to the LED chips 105 in parallel. In this embodiment, the printed resistors (107a to 107c) are provided at 3 portions on the primary surface of the ceramic substrate 101.

The dam resin 108 is a resin frame having a low optical transmittance or having light reflectivity, which is made of white silicone resin (translucent silicone resin (base material) including titanium oxide ($TiO_2$) as a light-diffusion filler). The dam resin 108 is provided annularly so as to surround a mounting area where the LED chips 105 are provided. The dam resin 108 has, in the top view, a rectangular shape having 4 rounded corners. The material of the dam resin 108 is not limited to the above material, and may be, for example, acryl, urethane, epoxy, polyester, acrylonitrile butadiene styrene (ABS), polycarbonate (PC), or the like resin. Further, the color of the dam resin 108 is not limited to white, and may be milky white, for example. When the resin is colored in white or milky white, it is possible to set an optical transmittance of the resin to be low, or to allow the resin to have light reflectivity.

The fluorescent-material-containing resin layer 109 is a sealing resin layer formed by curing a liquid silicone resin in which particulate fluorescent materials are dispersed. The particulate fluorescent materials used in the present embodiment are a red fluorescent material $SrCaAlSiN_3$:Eu and a green fluorescent material $Ca_3(Sc,Mg)_2Si_3O_{12}$:Ce. The fluorescent-material-containing resin layer 109 is provided adjacent to an inner side of the dam resin 108 so as to cover the LED chips 105 and the wires 106. The fluorescent-material-containing resin layer 109 has, in the top view, a rectangular shape having 4 rounded corners, in conformity to the shape of the dam resin 108. The vertical direction of the primary surface of the ceramic substrate 101 corresponds to a shorter-side direction of the fluorescent-material-containing resin layer 109, while the horizontal direction of the primary surface corresponds to a longitudinal direction of the fluorescent-material-containing resin layer 109.

The particulate fluorescent materials are not limited to the above examples, and BOSE (Ba, O, Sr, Si, Eu) or the like can be preferably used, for example. Further, other examples of the particulate fluorescent materials that can be preferably used encompass SOSE (Sr, Ba, Si, O, Eu), YAG (Ce-activated yttrium-aluminum-garnet), $CaAlSiN_3$:Eu, α-sialon ((Ca), Si, Al, O, N, Eu), β-sialon (Si, Al, O, N, Eu), and the like. Among these fluorescent materials selected is one(s) that allows the light emitting device 100 to emit light having a given color (chromaticity), in combination with emission color of the LED chips 105.

(Configuration of Electric Circuit)

Figure 4:
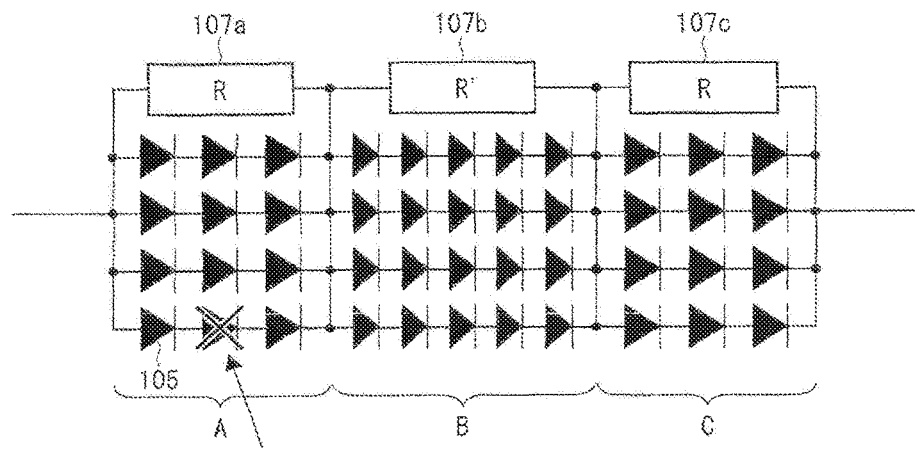
FIG. 4(a) is an equivalent circuit schematic illustrating a circuit configuration of the light emitting device of FIG. 3.
FIG. 4(b) is an equivalent circuit schematic illustrating a comparative example of FIG. 4(a).
Figure 4:
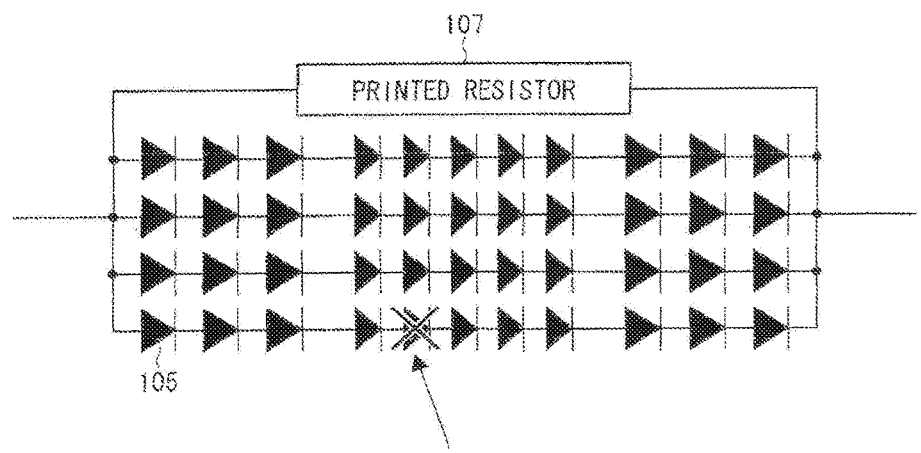

FIG. 4(a) is an equivalent circuit schematic illustrating the LED chips 105 and the printed resistors 107 in the light emitting device 100.

As illustrated in FIG. 4(a), in the light emitting device 100, 44 LED chips 105 are provided in a 11×4 matrix such that 4 series circuit sections, each of which is constituted by 11 LED chips 105 connected in series, are connected in parallel. Chip wiring in the series circuit sections is separated into 3 groups: (A) a 3-series-connection section; (B), a 5-series-connection section; and (C) a 3-series-connection section. More specifically, the light emitting device 100 is configured such that the following, 3 groups (A) to (C) are connected in series: a group (A) having a circuit configuration in which 4 series circuit sections each including 3 LED chips 105 connected in series are connected in parallel; a group (B) having a circuit configuration in which 4 series circuit sections each including 5 LED chips 105 connected in series are connected in parallel; and a group (C) having a circuit configuration in which 4 series circuit sections each including 3 LED chips 105 connected in series are connected in parallel.

The printed resistors 107 are provided in the respective groups: the series circuit sections in the group (A) are each connected to the printed resistor 107a in parallel; the series circuit sections in the group (B) are each connected to the printed resistor 107b in parallel; and the series circuit sections in the group (C) are each connected to the printed resistor 107c in parallel.

The 3 printed resistors 107a to 107c, which are respectively connected to the groups A to C of series circuit sections, are set such that the ratio of resistance value between the printed resistors 107a to 107c is equal to the ratio of the number of LED chips 105 between the groups A to C, so that a voltage is evenly applied to the LED chips 105.

Where the resistance value of the printed resistor 107a/107c is represented by R and the resistance value of the printed resistor 107b is represented by R', the resistance values R and R' are adjusted to satisfy the following equation:

$$R:R'=3:5$$

Note that the resistance values R and R' are set in a range from 1 MΩ to 10 GΩ so as to reduce, as much as possible, a reactive current when each of the LED chips 105 emits light.

In order to yield an effect of preventing the LED chips 105 from being damaged by surges, the resistance values of the printed resistors 107 are preferably smaller than resistance components of reverse-bias impedance of the LED chips 105, and are desirably not more than 10 GΩ. Further, in a case where a leak current flowing through the printed resistors 107 is restrained to the extent that a real defective product can be found in a defect inspection process, the resistance values of the printed resistors 107 are preferably not less than 1 MΩ. Note that the defect, inspection process is a process of finding a defective product by measuring a forward voltage in a microscopic area of each finished light emitting device. For the above reasons, it is preferable that the resistance values (R, R') of the printed resistors 107a to 107c be in the range of 1 MΩ to 10 GΩ.

As such, the LED chips 105 are arrayed in groups, and a printed resistor 107 is provided in each of the groups. This configuration is more effective in minimizing a decrease in light output when a given series circuit section is disconnected, as compared with a case where a single printed resistor 107 is connected in parallel with a series circuit section constituted by 11 LED chips 105 connected in series.

How much the above configuration is effective is explained more specifically, in comparison with a comparative example shown in FIG. 4(b). FIG. 4(b) is an equivalent circuit schematic in which 4 series circuit section, in each of which 11 LED chip 105 are connected in series, are connected in parallel with one another and with a single printed resistor 107. In a case where the 11 LED chips 105 are not separated into groups, but directly connected in series, as illustrated in FIG. 4(b), if a merely single LED chip 105 causes an open defect, no current flows, through all of the 11 LED chips 105, thereby resulting in that none of the 11 LED chip 105 emits light.

In contrast, as illustrated in FIG. 4(a), in a case where 11 LED chips 105 are connected by separating (sorting) them into groups of a 3-series connection group, a 5-series connection group, and another 3-series connection group, if one of 3 LED chips 105 in the 3-series connection group is open-defective, no current flows through all of the 3 LED chips 105 in the group. However, remaining 8 LED chips 105 in the other groups still emit light. Further, if one of 5 LED chips 105 in the 5-series connection group is open-defective, no current flows through all of 5 LED chips 105 in the group, but remaining 6 LED chips 105 in the other groups still emit light. In view of this, the configuration shown in FIG. 4(a) yields a significant effect of preventing such a problem that all the 11 LED chips do not emit light, unlike in the case of FIG. 4(b).

Further, the printed resistors 107a to 107c are connected to the LED chips 105 in parallel, thereby making it possible to prevent deterioration of the LED chips 105. This allows the LED chips 105 to be used for a longer term and ensures their reliability. As a result, it is possible to provide a light emitting device 100 having excellent reliability.

(Configuration of Ceramic Substrate 101)

The following deals with a configuration of the primary surface of the ceramic substrate 101. As has been already described, on the primary surface of the ceramic substrate 101 are provided the electrode wiring pattern 102, the anode-side elect rode land 103, and the cathode-side electrode land 104.

The electrode wiring pattern 102 is a wiring pattern provided between the anode-side electrode land 103 and the cathode-side electrode land 104 so as to electrically connect the LED chips 105 to the anode-side electrode land 103 and the cathode-side electrode land 104 directly or in relays. The electrode wiring pattern 102 is made of gold (Au) and disposed (formed) in accordance with a circuit configuration. In the present embodiment, the electrode wiring pattern 102 includes connection wiring lines 102a, 102d, 102g, and 102j, anode-side electrodes (first tight emitting element connection electrode) 102b, 102e, and 102h, and cathode-side electrodes (second light emitting element connection electrode) 102c, 102f, and 102i.

The anode-side electrode 102b and the cathode-side electrode 102e are electrodes provided for connecting LED chips 105 corresponding to the group (A) illustrated in FIG. 4(a). The anode-side electrode 102b is electrically connected to the LED chips, 105 via wires 106, while the cathode-side electrode 102c is electrically connected to the LED chips 105 via wires 106. The anode-side electrode 102b and the cathode-side electrode 102c sandwich a group of the LED chips 105 corresponding to the group (A), and disposed so as to face each other along the shorter-side direction of the fluorescent-material-containing resin layer 109. The anode-side electrode 102b, the cathode-side electrode 102c, and the group of the LED chips 105 corresponding to the group (A) constitute a group L1.

The anode-side electrode 102e and the cathode-side electrode 102f are electrodes for connecting LED chips 105 corresponding to the group (B) illustrated in FIG. 4(a). The a node-side electrode 102e is electrically connected to the LED chips 105 via wires 106, while the cathode-side electrode 102f is electrically connected to the LED chips 105 via wires 106. The anode-side electrode 102e and the cathode-side electrode 102f sandwich a group of the LED chips 105 corresponding to the group (B), and disposed so as to face each other along the shorter-side direction of the fluorescent-material-containing resin layer 109. The anode-side electrode 102e, the cathode-side electrode 102f, and the group of tire LED chips 105 corresponding to the group (B) constitute a group L2.

The anode-side electrode 102h and the cathode-side electrode 102i are electrodes provided for connecting LED chips 105 corresponding to the group (C) illustrated in FIG. 4(a). The anode-side electrode 102h is electrically connected to the LED chips 105 via wires 106, while the cathode-side electrode 102i as connected to the LED chips 105 via wires 106. The anode-side electrode 102h and the cathode-side electrode 102i sandwich a group of the LED chips 105 corresponding to the group (C), and disposed so as to face each other along the shorter-side direction of the fluorescent-material-containing resin layer 109. The anode-side electrode 102b, the cathode-side electrode 102i, and the group of the LED chips 105 corresponding to the group (C) constitute a group L3.

The groups L1 to L3 are aligned along the longitudinal, direction of the fluorescent-material-containing resin layer 109. The anode-side electrodes 102b, 102e, and 102h are aligned on the upper side of FIG. 1, i.e., disposed above the mounting area where the LED chips 105 are provided. The cathode-side electrodes 102c, 102f, and 102i are aligned on the under side of FIG. 1, i.e., disposed below the mounting area where the LED chips 105 are provided.

The connection wiring lines 102a, 102d, 102g, and 102j are interconnection wiring lines provided between the a node-side electrode land 103 and the cathode-side electrode land 104 so as to connect the groups L1 to L3 in series. The connection wiring line 102a electrically connects the anode-side electrode land 103 to the anode-side electrode 102b. The connection wiring line 102d electrically connects the cathode-side electrode 102c to the anode-side electrode 102e. The connection wiring line 102g electrically connects the cathode-side electrode 102f to the anode-side electrode 102h. The connection wiring line 102j electrically connects the cathode-side electrode 102i to the cathode-side electrode land 104. Each of the connection wiring lines 102a, 102d, 102g, and 102j is disposed along the shorter-side direction of the fluorescent-material-containing resin layer 109 and on a peripheral area of a corresponding one of the mounting areas where the groups L1 to L3 are provided.

The anode-side electrode land 103 and the cathode-side electrode land 104 are electrodes, connectable to an external voltage supply of the light emitting device 100. The anode-side electrode land 103 and the cathode-side electrode land 104 are made of silver (Ag)-platinum (Pt). The a node-side electrode land 103 is provided near a corner (at the upper right in FIG. 1) of the primary surface of the ceramic substrate 101. The cathode-side electrode land 104 is provided near another corner (at the lower left in FIG. 1) of the primary surface of the ceramic substrate 101, which corner is diagonally opposite the corner where the anode-side electrode land 103 is provided. That is, the anode-side electrode land 103 and the cathode-side electrode land 104 are disposed diagonally on the primary surface of the ceramic substrate 101.

The connection wiring lines 102a and 102j are extended co be connected to the anode-side electrode land 103 and the cathode-side electrode land 104, respectively. On this account, parts of the connection wiring, lines 102a and 102j are not covered with the dam resin 108 and the fluorescent-material-containing resin layer 109. In view of this, it is preferable to provide insulation protection films 110 on these parts of the connection wiring lines 102a and 102j, which parts are uncovered with the dam resin 108 and the fluorescent-material-containing resin layer 109.

As such, on the primary surface of the ceramic substrate 101, the anode-side electrode (102b, 102e, 102h) and the cathode-side electrode (102c, 102f, 102i) are disposed so as to sandwich a corresponding mounting area where corresponding LED chips 105 are provided. Further, in respective mounting areas of the LED chips 105 of the groups L1 to L3 (groups (A) to (C)), the LED chips 105 are directly wire-bonded so as to be electrically connected to each other, as will be described later. This configuration accordingly does not require electrode wiring patterns that are conventionally used. The connection wiring lines 102a, 102d, 102g, and 102j are disposed on peripheral areas of the respective groups of the LED chips 105 of the groups L1 to L3 (groups (A) to (C)), so as not to cross the mounting areas where the groups of LED chips 105 are provided.

As a result, it is possible to reduce distances between the LED chips 105, thereby increasing a packaging density of the LED chips 105. This restrains that light emitted from the LED chips 105 appears bright dots, and further restrains in-plane luminance unevenness the light emitting device 100. Further, the configuration allows the light emitting device 100 to be downsized.

Further, the anode-side electrode 102c and the cathode-side electrode 102f are partially provided below the dam resin 108. Accordingly, it is possible to restrain light absorption by the anode-side electrode 102e and the cathode-side electrode 102f. Thus, when a largest possible part of the electrode wiring pattern 102 is disposed below the resin frame, it is possible the restrain light absorption by these electrodes. Further, in the configuration, the number of connection wiring lines is reduced as much as possible. This can improve luminous efficiency.

The connection wiring lines (especially, the connection wiring lines 102d and 102g) are preferably provided to have widths narrower than those of the anode-side electrodes 102b, 102e, and 102h and the cathode-side electrodes 102c, 102f, and 102i, so as to be reduced in area. One reason is as follows: The fluorescent-material-containing resin layer 109 may sometimes be stripped at an interface between, the fluorescent-material-containing resin layer 109 and the ceramic substrate 101 and at an interface between the fluorescent-material-containing resin layer 109 and the connection wiring lines. This is because during a light-emission period and a no-light-emission period, a difference of adhesive property and a difference of coefficient of thermal expansion are caused between (a) the fluorescent-material-containing resin layer 109 and (b) a respective of the ceramic substrate 101 and the connection wiring lines, due to thermal burdens, such as heat cycle, applied thereto. However, with the above configuration, it is possible to restrain the stripping of the fluorescent-material-containing resin layer 109. Further, the above configuration can reduce light loss due to connection wiring lines, which are disposed across the mounting surface, and restrain in-plane luminance unevenness of the light emitting device.

Further, the anode-side electrodes 102b, 102e, and 102h are disposed on a same side on the mounting surface, while the cathode-side electrodes 102c, 102f, and 102i are provided on another same side on the mounting surface. This allows chip electrodes of the LED chips 105 to be disposed along a given polar direction, when the LED chips 105 are provided on the mounting surface. It is accordingly possible to die-bond the LED chips 105 without changing the polar direction of their chip electrodes, i.e., without changing the orientation of the LED chips 105, thereby simplifying a die-bonding device/process for die-bonding the LED chips 105.

The anode-side electrode 102b and 102h are positioned at a more inner side than the anode-side electrode 102e, and the cathode-side electrodes 102c and 102i are positioned at a more inner side than the cathode-side electrode 102f. As such, a distance between the anode-side electrode 102b and the cathode-side electrode 102c and a distance between the anode-side electrode 102h and the cathode-side electrode 102j are narrower than a distance between the anode-side electrode 102e and the cathode-side electrode 102f. This increases likelihood of wire-bonding areas for the anode-side electrodes 102b and 102h and the cathode-side electrode 102c and 102i, and accordingly improves work ability of wire bonding. Note however that in a case where a decrease in light absorption by the electrode wiring pattern 102 is prioritized, the electrode wiring pattern may not be formed in this manner.

(Layout of LED Chips 105)

Next will be explained about bow to arrange the LED chips 105. As described above, LED chips 105 are divided into 3 groups L1 to L3, in consideration of the aforementioned circuit configuration and mounting area.

In the group L1, there are provided, between the anode-side electrode 102b and the cathode-side electrode 102c, 4 series circuit sections, which are aligned along the longitudinal direction of the fluorescent-material-containing resin layer 109 so as to be electrically connected in parallel with each other. Each of the series circuit sections is configured such that 3 LED chips 105 are arrayed in series along the shorter-side direction of the fluorescent-material-containing resin layer 109 so as to be electrically connected in series with each other.

In the group L2, there are provided, between the anode-side electrode 102e and the cathode-side electrode 102f, 4 series circuit suctions, which are aligned along the longitudinal direction of the fluorescent-material-containing resin layer 109 so as to be electrically connected in parallel with each other. Each of the series circuit sections is configured such that 5 LED chips 105 are arrayed in series along the shorter-side direction of the fluorescent-material-containing resin layer 109 so as to be electrically connected in series with each other.

In the group L3, there are provided, between the anode-side electrode 102h and the cathode-side electrode 102i, 4 series circuit sections, which are aligned along the longitudinal direction of the fluorescent-material-containing resin layer 109 so as to be electrically connected in parallel with each other. Each of the series circuit sections is configured such that 3 LED chips 105 are arrayed in series along the shorter-side direction of the fluorescent-material-containing resin layer 109 so as to be electrically connected in series with each other.

The 3 groups L1 to L3 are aligned such that a smaller number of LED chips 105 are provided at corner sections of the fluorescent-material-containing resin layer 109 so that the mounting area is reduced in total. That is, the group L2 is positioned around a center of the primary surface of the ceramic substrate 101. The groups L1 and L3 are positioned at respective sides of the group L2 along the longitudinal direction of the fluorescent-material-containing resin layer 109. The number of LED chips 105 in each of the groups L1 and L3 is smaller than that of the group 2. On this account, the groups L1 and L3 are provided with sufficient room so as to conform to the shape of the fluorescent-material-containing resin layer 109 and to ensure an electrode wiring pattern area having a wire-bonding area.

Such a configuration in which the plurality of LED chips 105 are provided in 3 groups (L1 to L3) makes it possible to form the mounting area where the LED chips 105 are provided, in a rectangular shape as small as possible. Further, the configuration makes it possible to reduce an area for the layout on the ceramic substrate 101, including the anode-side electrode land 103 and the cathode-side electrode land 104. As a result, it is possible to realize a light emitting device 100 that is more downsized.

Further, in each of the groups L1 to L3, each of the series circuit sections is configured such that adjoining LED chips 105 are connected by wire-bonding in such a manner that a cathode electrode of one of the adjoining LED chips 105 is directly connected to an anode electrode of the other one of the adjoining LED chip 105. As such, in each of the groups L1 to L3, no electrode wiring pattern 102 for interconnecting adjoining LED chips 105 is provided, thereby resulting in that distances between the adjoining LED chips 105 are reduced and the packaging density of the LED chips 105 can be increased.

Further, all the LED chips 105 are aligned in the same orientation and each of the LED chips 105 is disposed such that its cathode electrode and anode electrode face each other along the shorter-side direction of the fluorescent-material-containing resin layer 109. That is, all the LED chips 105 are configured such that their chip electrodes are disposed in the same orientation, and aligned such that their longitudinal directions on their top surfaces are along the shorter-side direction of the fluorescent-material-containing resin layer 109. In the present embodiment, the anode electrode is positioned on an upper side of an LED chip (see FIG. 1). This configuration makes it possible to die-bond the LED chips 105 without changing the polar directions of their chip electrodes, i.e., without changing the orientation of the LED chips 105.

(Layout of Printed Resistors 107)

Next will be explained about how to arrange the printed resistors 107. The printed resistors 107 are provided as printed resistors 107a to 107c for the respective groups (L1, L2, and L3).

The printed resistor 107a is electrically connected to the connection wiring line 102a and the anode-side electrode 102c. Further, the printed resistor 107a is provided in alignment with the anode-side electrode 102c. The printed resistor 107b is electrically connected to the cathode-side electrode 102c and the cathode-side electrode 102f. Further, the printed resistor 107b is provided in alignment with the connection wiring line 102d. The printed resistor 107c is electrically connected to the cathode-side electrode 102f and the connection wiring line 102j. Further, the printed resistor 107c is provided in alignment with the cathode-side electrode 102f.

The printed resistors 107a to 107c are provided on a periphery of the mounting area where the LED chips 105 are provided. Moreover, most parts of the printed resistors 107a and 107c and a part of the printed resistor 107b are disposed below the dam resin 108 having a low optical transmittance.

As such, largest possible pans of the printed resistors 107a to 107c are provided below the dam resin 108 so as to be covered with the dam resin 108, thereby restraining light absorption the printed resistors 107a to 107c as much as possible. Accordingly, it is possible to prevent a decrease of light output of the light emitting device 100.

(Configuration of Dam Resin 108)

The following describes the configuration of the dam resin 108, more specifically.

As illustrated in FIG. 3, a cross section of the dam resin 108 has a dome shape (upper side<lower side) that projects upward. The shape of the cross section causes light emitted from the LED chips 105 in a lateral direction, especially toward a direction of the dam resin 108, to reflect off the dam resin 108. This yields an effect that the light can be easily directed toward a front surface of the substrate.

The shape of the cross section of the dam resin 108 is not limited to this. Further, in order to minimize an area where the fluorescent-material-containing resin layer 109 is to be formed, it is preferable that the dam resin 108 be provided so as to cover a part of the electrode wiring pattern 102 and parts of the wires 106, too.

(Configuration of Fluorescent-Material-Containing Resin Layer 109)

Next will be explained about the configuration of the fluorescent-material-containing resin layer 109.

As illustrated in FIG. 3, a cross section of the fluorescent-material-containing resin layer 109 has a dome shape (upper side<lower side) that projects upward. That is, the fluorescent-material-containing resin layer 109 appears to be formed in such a shape that an oval sphere is partially cut out. The light emitting device 100 is configured such that a dome-shaped surface (spherical shape) of the fluorescent-material-containing resin layer 109 is a light-emission surface of the light emitting device 100. In view of this, when the light-emission surface is formed in the above shape as such, it is possible to cause light from the LED chips 105 and light from the fluorescent materials to be outputted efficiently. As a result, it is possible to yield an effect of improving luminous efficiency.

Further, the shape of the surface of the fluorescent-material-containing resin layer 109 is not limited to the aforementioned dome shape. It is also possible to adjust a degree of how much the fluorescent-material-containing resin layer 109 is projecting, depending on its viscosity. For example, the surface of the fluorescent-material-containing resin layer 109 may be formed in an almost-flat shape having a slight recess in its center portion or in a slightly projecting shape having a smooth curved surface.

(Production Method)

The following briefly describes how to produce the light emitting device 100 having the aforementioned configuration.

The light emitting device 100 is produced in such a manner that a group of a plurality of light emitting devices is collectively formed on a single large ceramic substrate, and the single large ceramic substrate is diced along peripheries of individual light emitting devices at the end of the production process so as to separate the individual light emitting devices. Thus, individual light emitting devices 100 are produced.

Initially, on a primary surface of a ceramic substrate 101 are formed an electrode wiring pattern 102, an anode-side electrode land 103, and a cathode-side electrode land 104. Then, printed resistors 107 are formed, on the primary surface of the ceramic substrate 101 by printing, for example. After that, LED chips 105 are die-bonded on the primary surface of the ceramic substrate 101, and then wire-bonded by wires 106.

Subsequently, a dam resin 108 is formed on the primary surface of the ceramic substrate 101. More specifically, the dam resin 108 is formed by plotting liquid white silicone resin (containing a light-diffusion filler ($TiO_2$)) by use of a dispenser. The dam resin is cured at 120° C. for 60 minutes.

Subsequently a dome-shaped fluorescent-material-containing resin layer 109 is formed on the primary surface of the ceramic substrate 101 as illustrated in FIG. 3. More specifically, the fluorescent-material-containing resin layer 109 is filled, by use of a dispenser, into an area surrounded by the dam resin 108. Lastly, the ceramic substrate 101 is divided into individual light emitting devices 100. Thus, the light emitting device 100 can be produced. With the use of the production method, it is possible to easily produce the light emitting device 100 at a low cost.

Instead of the dam resin 108, a shaped sheet prepared in the shape of the dam resin 108 may be attached on the primary surface of the ceramic substrate 101. The shaped sheet is prepared by forming fluoro-rubber or silicone rubber into a sheet, and may have an adhesive sheet on one side thereof that is to be attached to the primary surface of the ceramic substrate 101.

Further, in the present embodiment, the dam resin 108 is ensured to be incorporated into the light emitting device 100. However, in a case where the shaped sheet is attached to the primary surface of the ceramic substrate 101, the shaped sheet may be removed eventually depending on an intended light distribution characteristic of the light emitting device 100.

Further, how to form the fluorescent-material-containing resin layer 109 is also not limited to the aforementioned method in which the material of the fluorescent-material-containing resin layer 109 is filled, by use of a dispenser, into the area surrounded by the dam resin 108. For example, instead of using the dam resin 108, the fluorescent-material-containing resin layer 109 may be formed by collectively sealing the LED chips 105 and the electrode wiring pattern 102 by a translucent resin containing fluorescent materials, by means of compression molding or transfer molding by use of a mold or the like.

The aforementioned production method of the light emitting device 100 makes it possible to easily form the dam resin 108 and the fluorescent-material-containing resin layer 109 on the printed resistors 107. This allows the printed resistors 107 to be highly flexibly disposed in desirable areas. That is, the printed resistors 107 can be disposed in vicinity to the LED chips 105 and below the dam resin 108 and the fluorescent-material-containing resin layer 109.

In the above production method, the LED chips 105 are initially mounted, wire-bonding is carried out, and then the dam resin 108 is formed. However, the order of the processes is not limited to this, and may be, for example, such that the dam resin 108 is formed first, the LED chips 105 are mounted, and finally wire-bonding is carried out.

Exemplary dimensions of the members provided in the light emitting device 100 having the aforementioned eon figuration are described below.

Ceramic Substrate 101: overall size of 12 mm×15 mm, 1 mm in thickness

Electrode Wiring Pattern 102: 300 µm in width and 10 µm in thickness

Anode-Side Electrode Land 103 and Cathode-side Electrode Land 104: 1.4 mm in diameter, 2 mm of linear portion, 20 µm in thickness LED chip 105: 240 µm in width, 400 µm in length, 80 µm in height Dam Resin 108: 0.7 mm in ring width, overall size of 6.9 mm×7.9 mm, R of corner pardon=2 mm These dimensions are merely an example.

Modified Example

The aforementioned light emitting device 100 uses a ceramic substrate 101, but is not limited to this. The light emitting device 100 may use other substrates instead. For example, a metal core substrate including a metal substrate on whose surface an insulating layer is provided may be used. In this case, the insulating layer is formed only in an area where the printed resistors 107 and the electrode wiring pattern 102 are to be formed, so that a plurality of LED chips 105 are directly provided on the metal substrate surface.

Further, the outer shape of the ceramic substrate 101 is not limited to a rectangular shape. Further, the vertical direction (up-and-down direction/first direction) and the horizontal direction (left-to-right direction/second direction) on the primary surface is not determined based on the outer shape of the primary surface, but is determined depending on relative positional relationship of the electrode wiring pattern 102, the LED chips 105, and the like.

Further, the LED chip 105 is rectangle in the top view, but may be square. The LED chip 105 may be, for example, an LED chip that is 300 micrometers square and 100 micrometers high. Further, how to mount LED chips 105 is not limited to the wire-bonding, and may be, for example, flip-chip bonding (not shown).

Further, the number of LED chips 105, how the LED chips 105 are to be separated in groups, and how the circuit is to be configured are not limited to those which have been described above. For example, in a case where the number of LED chips 105 is 44 as exemplified above, it is also possible to divide the LED chips 105 into the following groups: "a group (A) in which each series circuit section includes 4 LED chips connected in series; a group (B) in which each series circuit section includes 4 LED chips connected in series; and a group (C) in which each series circuit section includes 4 LED chips connected in series". Such a configuration also yields the same effect. That is, the plurality of LED chips 105 may be provided in any manner as long as at least 2 series circuit sections, in each of which at least 2 LED chips 105 are connected in series, are connected in parallel.

Further, although the flexibility to the mounting area is decreased, a Zener diode may be used instead of the printed resistor 107. In this case, it is possible to use a plurality of Zener diodes according to the number of LED chips 105 connected in series in a aeries connection section.

Next will be explained about other embodiments of the present invention, based on drawings. Configurations other than a configuration that will be explained below in each embodiment are the same as in Embodiment 1. Further, for convenience of explanation, in each embodiment, a member having the same function as its corresponding member shown in the drawings of Embodiment 1 has the same reference sign, and will not be explained here.

Embodiment 2

Figure 5:
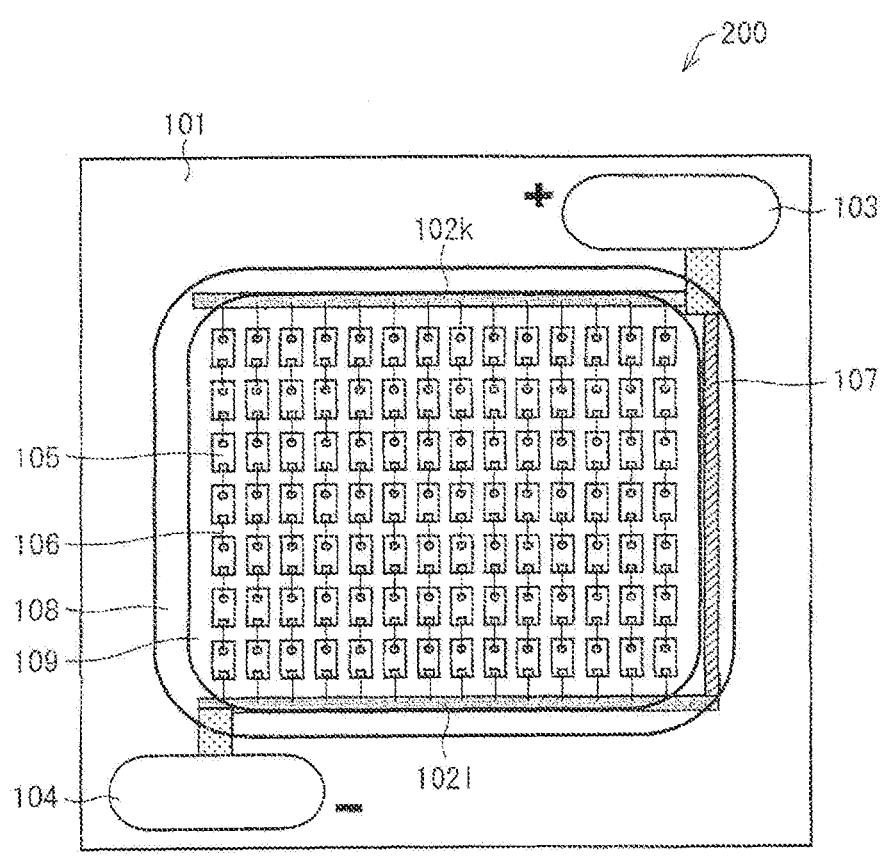
FIG. 5 is a top view illustrating a light emitting device according to Embodiment 2 of the present invention.

FIG. 5 is a top view illustrating one exemplary configuration of a light emitting device 200 of the present embodiment.

The light emitting device 200 of the present embodiment is different from the light emitting device 100 of Embodiment 1 in terms of how the electric circuit is configured. Except for this point, the light emitting device 200 has a configuration equivalent of the Tight emitting device 100 of Embodiment 1.

As illustrated in FIG. 5, the light emitting, device 200 has a circuit configuration in which 14 series circuit sections, in each of which 7 LED chips 105 are linearly aligned so as to be connected in series, are connected to parallel. In other words, 98 LED chips 105 in total, which are connected in a series-parallel, connection (i.e., 7 series-connected LED chips per series circuit section×14 parallel-connected series circuit sections), are provided on a primary surface of a ceramic substrate 101.

The electrode wiring pattern 102 is constituted by an anode-side electrode 102k and a cathode-side electrode 102l. The anode-side electrode 102k and the cathode-side electrode 102l are electrically connected with the LED chips 105 via wires 106. The anode-side electrode 102k and the cathode-side electrode 102l are disposed so as to sandwich a group of the LED chips 105 and to face each other along a shorter-side direction of a fluorescent-material-containing resin layer 109 (a direction along which the LED chips 105 are linearly aligned).

A single printed resistor 107 is provided so as to be connected in parallel with the series circuit sections. That is, the printed resistor 107 is connected to the anode-side electrode 102k and the cathode-side electrode 102l. The printed resonator 107 is provided vertically to the anode-side electrode 102k and the cathode-side electrode 102l, in she top view.

Similarly to the light emitting device 100 of Embodiment 1, the light emitting device 200 has effects of restraining, by the printed resistor 107, defection due to disconnection in a series circuit section constituted by LED chips 105 and minimizing a decrease in light output when a series circuit section constituted by LED chips 105 is disconnected.

Embodiment 3

Figure 6:
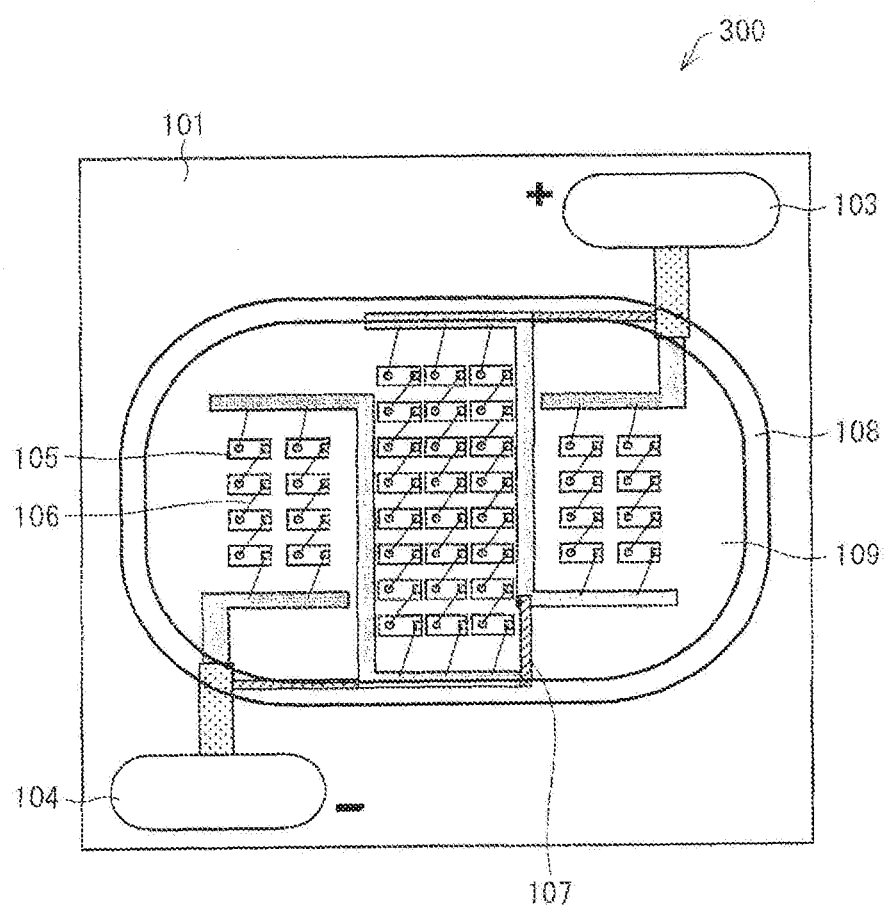
FIG. 6 is a top view illustrating a light emitting device according to Embodiment 3 of the present invention.

FIG. 6 is a top view illustrating one exemplary configuration of a tight emitting device 300 of the present embodiment.

The light emitting device 300 of the present embodiment is different from the light emitting device 100 of Embodiment 1 in terms of a mounting direction, (polar direction) of LED chips 105 and a wiring direction of wires 106 corresponding to the mounting direction. Except for this point, the light emitting device 300 has a configuration equivalent of the light emitting device 100 of Embodiment 1.

As illustrated in FIG. 6, the light emitting device 300 is constituted by the following groups L1 to L3: (i) the group L1 is configured such that 2 series circuit sections each including 4 LED chips 105 connected in series are connected in parallel; (ii) the group L2 is configured such that 3 series circuit sections each including 8 LED chips 105 connected in series are connected in parallel; and (iii) the group L3 is configured such, that 2 series circuit sections each including 4 LED chips 105 connected in series are connected in parallel. That is, 40 LED chips 105 in total, which are connected in a series-parallel connection, are provided cm a primary surface of a ceramic substrate 101.

Further, each of the LED chips 105 is aligned such that its longitudinal direction is consistent with a longitudinal direction of a fluorescent-material-containing resin layer 109. That is, the LED chips 105 in the light emitting device 300 are rotated by 90° with respect to the orientation direction of the LED chips 105 in the light emitting device 100. Wires 106 are provided obliquely in conformity to the alignment of the LED chips 105.

In the light emitting device 300, in addition to the same effects as the light emitting device 100 of Embodiment 1, it is possible to reduce a dam resin 108 in size, thereby allowing the light emitting device 100 to approximate a point light source. Further, in the light emitting device 300, it is possible to broad a space between the mounting area of LED chips 105 and a respective of the mounting areas of an anode-side electrode land 103 and an cathode-side electrode land 104. This yields such an effect that the LED chips 105 are easily bonded.

Note that the light emit ting device 300 requires a more amount of wires than in the light emitting device 100 because the wires 106 become longer than that in the light emitting device 100. In view of this, the configuration of the light emitting device 100 is more preferable than the configuration of the light emitting device 300, as a whole.

Embodiment 4

Figure 7:
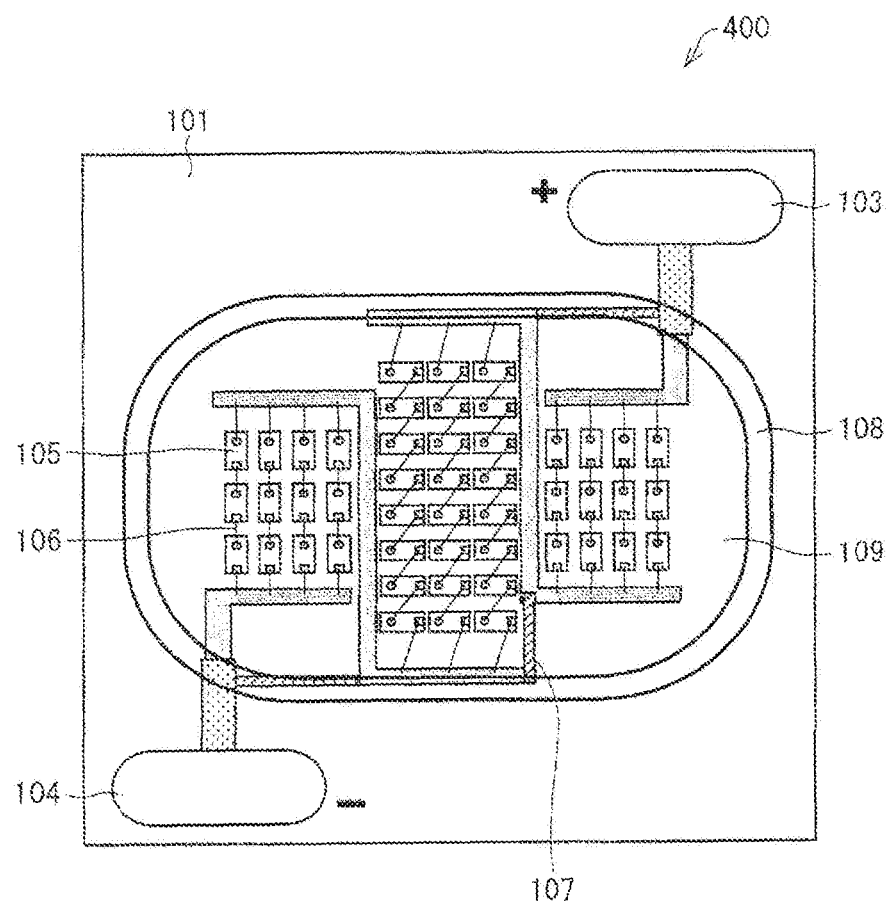
FIG. 7 is a top view illustrating a light emitting device according to Embodiment 4 of the present invention.

FIG. 7 is a lop view illustrating one exemplary con figuration of a light emitting device 400 of the present embodiment.

The light emitting device 400 of the present embodiment as different from the light emitting device 100 of Embodiment 1 in how to configure LED chips 105 and wires 106 in the group L2. Except for this point, the light emitting device 400 has a configuration equivalent of the light emitting device 100 of Embodiment 1.

As illustrated in FIG. 7, the light emitting, device 400 is configured such that in a group L2, 3 series circuit sections each including 8 LED chips 105 connected in series are connected in parallel. In view of this, in the light emitting device 400, 48 LED chips 105 in total, which are connected in a series-parallel connection, are provided on a primary surface of a ceramic substrate 101. Each of the LED chips 105 in the group L2 is aligned such that its longitudinal direction is consistent with a longitudinal direction of a fluorescent-material-containing resin layer 109. Accordingly, wires 106 are provided obliquely in conformity to the alignment of the LED chips 105.

In the light emitting device 400, it is possible to provide a larger number of LED chips 105 within an area surrounded by a dam resin 108 having the same size as the dam resin 108 provided in the light emitting device 300 of Embodiment 3. In this way, in which or orientation direction LED chips 105 are aligned may vary between groups so that an intended number of LED chips can be provided.

Embodiment 5

Figure 8:
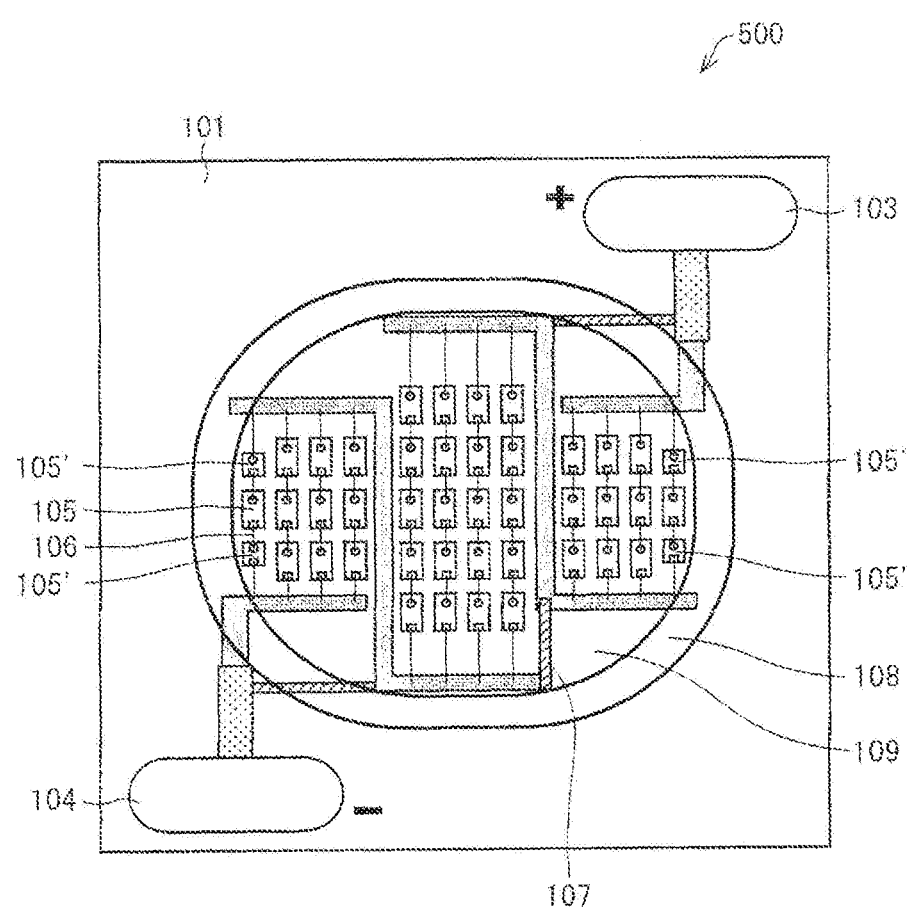
FIG. 8 is a top view illustrating a light emitting device according to Embodiment 5 of the present invention.

FIG. 8 is a top view illustrating one exemplary configuration of a light emitting device 500 of the present embodiment.

The light emitting device 500 of the present embodiment is different from the tight emitting device 100 of Embodiment 1 in that the light emitting device 500 includes 40 LED chips 105 and 4 LED chips 105', while the light emitting device 100 includes 44 LED chips 105. Except for this point, the light emitting device 500 has a configuration equivalent of the light emitting device 100 of Embodiment 1.

The LED chip 105' is smaller than the LED chip 105 in chip size (for example, a square of 0.3 mm×0.3 mm in the top view). On the whole, as illustrated in FIG. 8, the LED chips 105' are placed at 4 corners of a mounting area where the LED chips 105 are provided. That is, the LED chips 105' are provided at 4 corners of an area where a fluorescent-material-containing resin layer 109 is provided, which 4 corners are placed proximal to a dam resin 108, As such, the light emitting device 500 includes the LED chips 105' placed at the 4 corners of the area where the fluorescent-material-containing resin layer 109 is provided, which 4 corners are proximal to the dam resin 108. The LED chips 105' are smaller in size than the LED chips 105 that are provided in the area other than the 4 corners. This configuration can reduce, in size, a frame made of the dam resin 108, thereby making it possible to reduce a light emission area.

Embodiment 6

Figure 9:
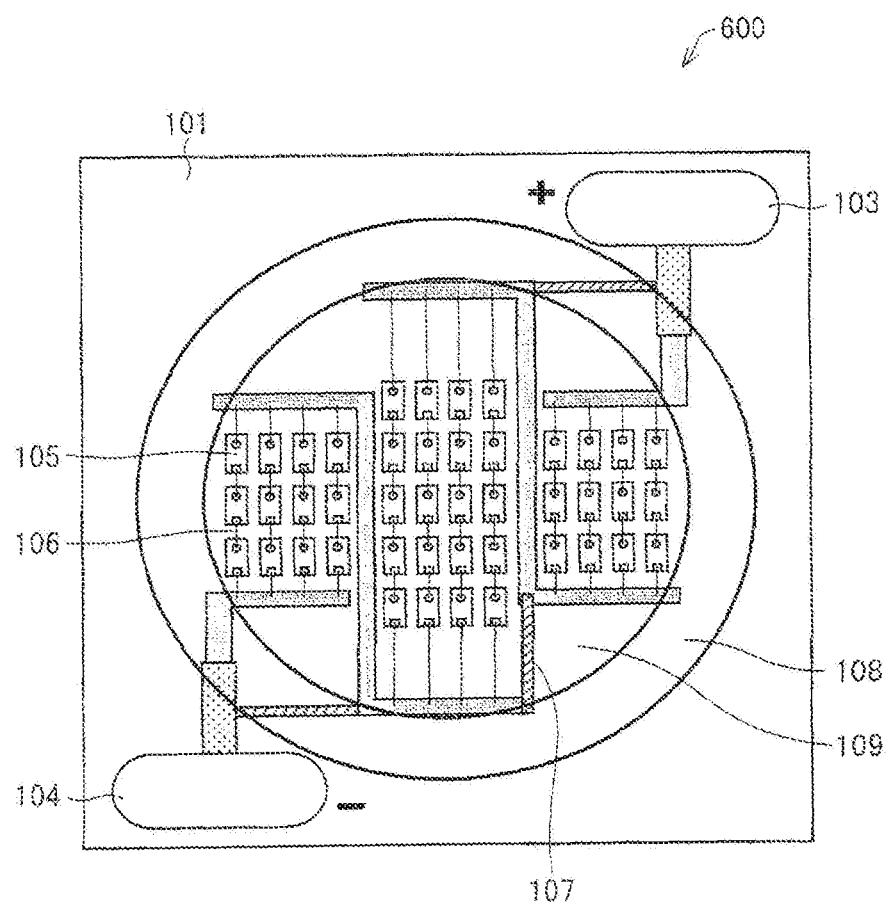
FIG. 9 is a top view illustrating a light emitting device according to Embodiment 6 of the present to mention.

FIG. 9 is a top view illustrating one exemplary configuration of a light emitting device 600 of the present embodiment.

The light emitting device 600 of the present embodiment is different from the light emitting device 100 of Embodiment 1 in the shapes of the dam resin 108 and the fluorescent material-containing resin layer 109. Except for this point, the light emitting device 600 has a configuration equivalent of the light emitting device 100 of Embodiment 1.

As illustrated in FIG. 9, in the light emitting device 600, a dam resin 108 has an annular shape in the top view. A large part of the dam resin 108 is formed on printed resistors 107. A fluorescent-material-containing resin layer 109 is provided along the shape of the dam resin 108 so as to have a circular shape in the top view.

In the light emitting device 600, the fluorescent-material-containing resin layer 109 is formed in a circular shape as such, thereby causing light emitted from LED chips 105 to easily output in all directions, uniformly. Further, with the above configuration, the light emitting device 600 can be easily applied to a general-purpose lighting apparatus, and such a general-purpose lighting apparatus to which the light emitting device 600 is applied can be easily designed.

Embodiment 7

Figure 10:
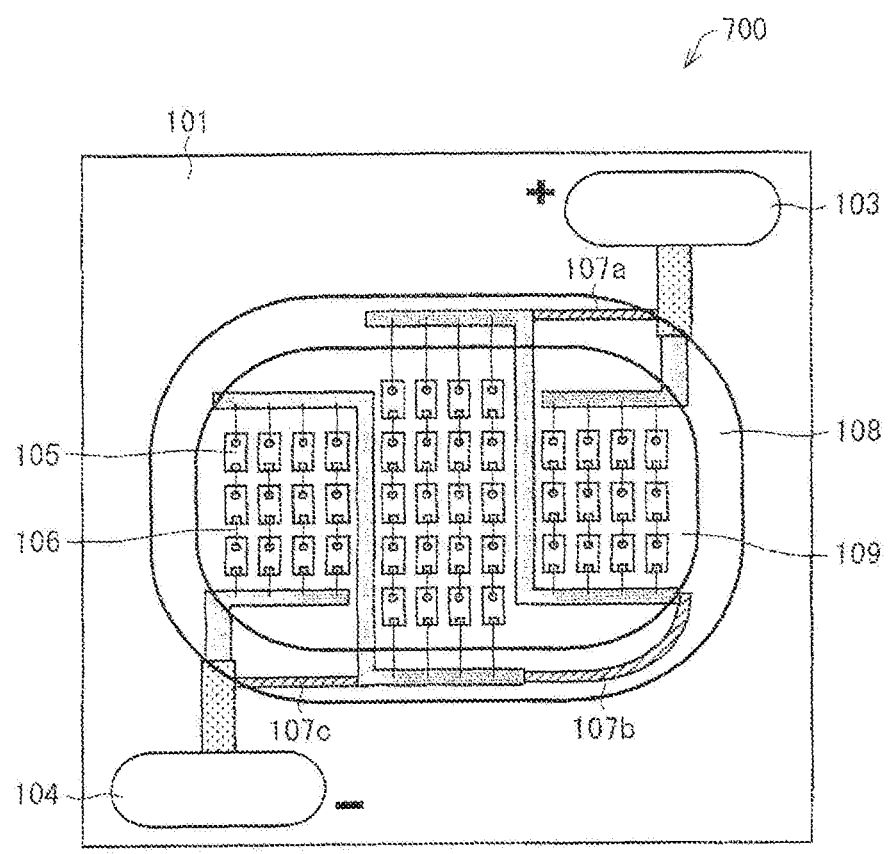
FIG. 10 is a top view illustrating a light emitting device according to Embodiment 7 of the present invention.

FIG. 10 is a top view illustrating one exemplary configuration of a light emitting device 700 of the present invention.

The light emitting device 700 of the present invention is different from the light emitting device 100 of Embodiment 1 in terms of a region where the printed resistor 107b is provided and a region where the dam resin 108 is provided.

Except for this point, the light emitting device 700 has a configuration equivalent of the light emitting device 100 of Embodiment 1.

As illustrated in FIG. 10, in the light emitting device 700, a printed resistor 107b is formed along a curve of a dam resin 108 so as to be disposed below the dam resin 108. The dam resin 108 is formed rather wide so as to cover all printed resistors 107a to 107c.

In the light emitting device 700, all the printed resistors 107a to 107c are covered with the dam resin 108 and disposed at positions that do not cause the printed resistors 107a to 107c to diminish other optical characteristics. This makes it possible to minimize loss of luminous efficiency due to light absorption by the printed resistors 107a to 107c.

Embodiment 8

Figure 11:
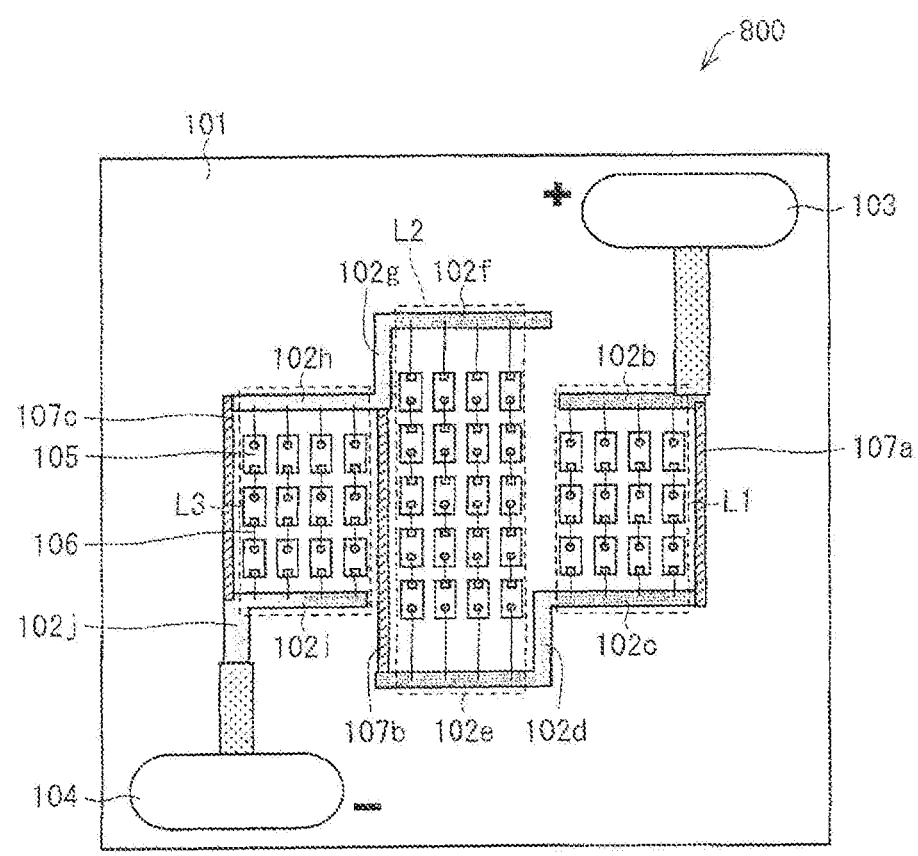
FIG. 11 is a top view illustrating a light emitting device according to Embodiment 8 of the present invention.

FIG. 11 is a top view illustrating one exemplary configuration of a light emitting device 800 of the present embodiment.

The light emitting device 800 of the present embodiment is different from the light emitting device 100 of Embodiment 1 in terms of in which orientation direction the LED chips 105 in the group L2 are provided. Except for this point, the light emitting device 800 has a configuration equivalent of the light emitting device 100 of Embodiment 1. In FIG. 11, a dam resin 108 and a fluorescent-material-containing resin layer 109 are not illustrated, but these members are also provided in the light emitting device 800 in the same manner as in FIG. 2.

As illustrated in FIG. 11, in the light emitting device 800, LED chips 105 in a group L2 are aligned in such an orientation that their cathode electrodes are placed on upper sides of the LED chips 105. That is, the LED chips 105 in the group L2 in the light emitting device 800 are rotated by 180° with respect to the orientation direction of the LED chips 105 in the group L2 in the light emitting device 100. Accordingly, an electrode wiring pattern 102 is provided in the light emitting device 800 such that an anode-side electrode 102e and a cathode-side electrode 102f are positioned in an inverse manner to the light emitting device 100 of Embodiment 1. Further, printed resistors 107 have the same electric circuit configuration as the light emitting device 100, but they are formed on different positions from those in the light emitting device 100.

In the light emitting device 800, it is not necessary that (a) a connection wiring line 102d for connecting a group L1 to the group L2 be disposed therebetween and (b) a connection wiring line 102g for connecting the group L2 to a group L3 be disposed therebetween. Accordingly, it is possible to reduce loss of light absorption by these wiring lines.

The light emitting devices according to Embodiments 1 to 8 described above each essentially include a printed resistor(s) 107. However, in a case where the light emitting device according to any of Embodiments 1 to 8 is used for a purpose that does not require an electrostatic discharge resistance so much or in a case where each LED chip 105 itself has a high electrostatic discharge resistance, the light emitting device according to any of Embodiments 1 to 8 may not include the printed resistor(s) 107.

Embodiment 9

The present embodiment deals with an electronics device including any of the light emitting devices described in Embodiments 1 to 8.

For example, there is an illuminating device including: (i) a base board having a voltage supply circuit on its back side, and a radiator plate integrated therein; and (ii) a light emitting device according to any one of Embodiment 1 to 8, which is provided on the base board. The light emitting device is configured such that the anode-side electrode land 103 and the cathode-side electrode land 104 are electrically connected, via external wiring lines or the like, to an anode electrode land and a cathode electrode land of the base board, respectively. A top surface of the light emitting device is covered with either a case having a light-diffusing function or a transparent case.

Further, the number of light emitting devices to be provided in the illuminating device is not limited to 1. For example, the illuminating device may be a fluorescent illuminating device constituted by a plurality of light emitting devices. In this case, the plurality of light emitting devices are disposed such that one sides of rectangular ceramic substrates 101 thereof are aligned in parallel or one diagonals of the rectangular ceramic substrates 101 are aligned in line. Note that just a single light emitting device may be provided in an illuminating device so that the illuminating device serves as an electric-bulb illuminating device.

Figure 12:
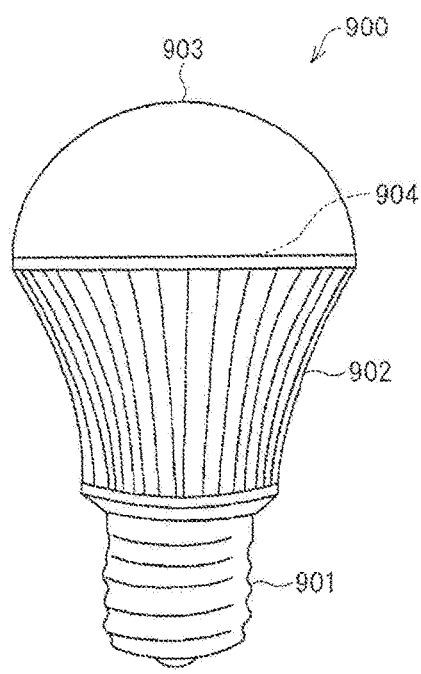
FIG. 12(a) illustrates one embodiment of an LED electric bulb including a light emitting device of the present invention, particularly illustrating an appearance of a side face of the LED electric bulb.
FIG. 12(b) illustrates one embodiment of an LED electric bulb including a light emitting device of the present invention, particularly illustrating a mounting surface on which the light emitting device is provided.
Figure 12:
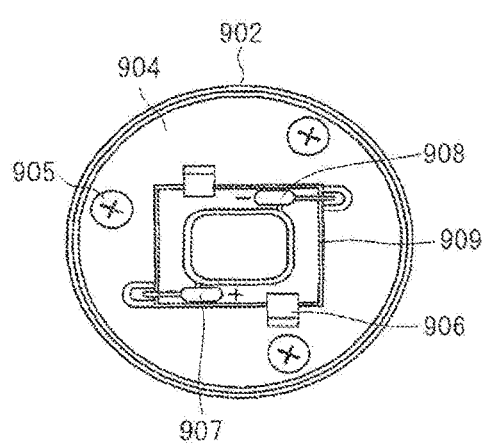
Figure 13:
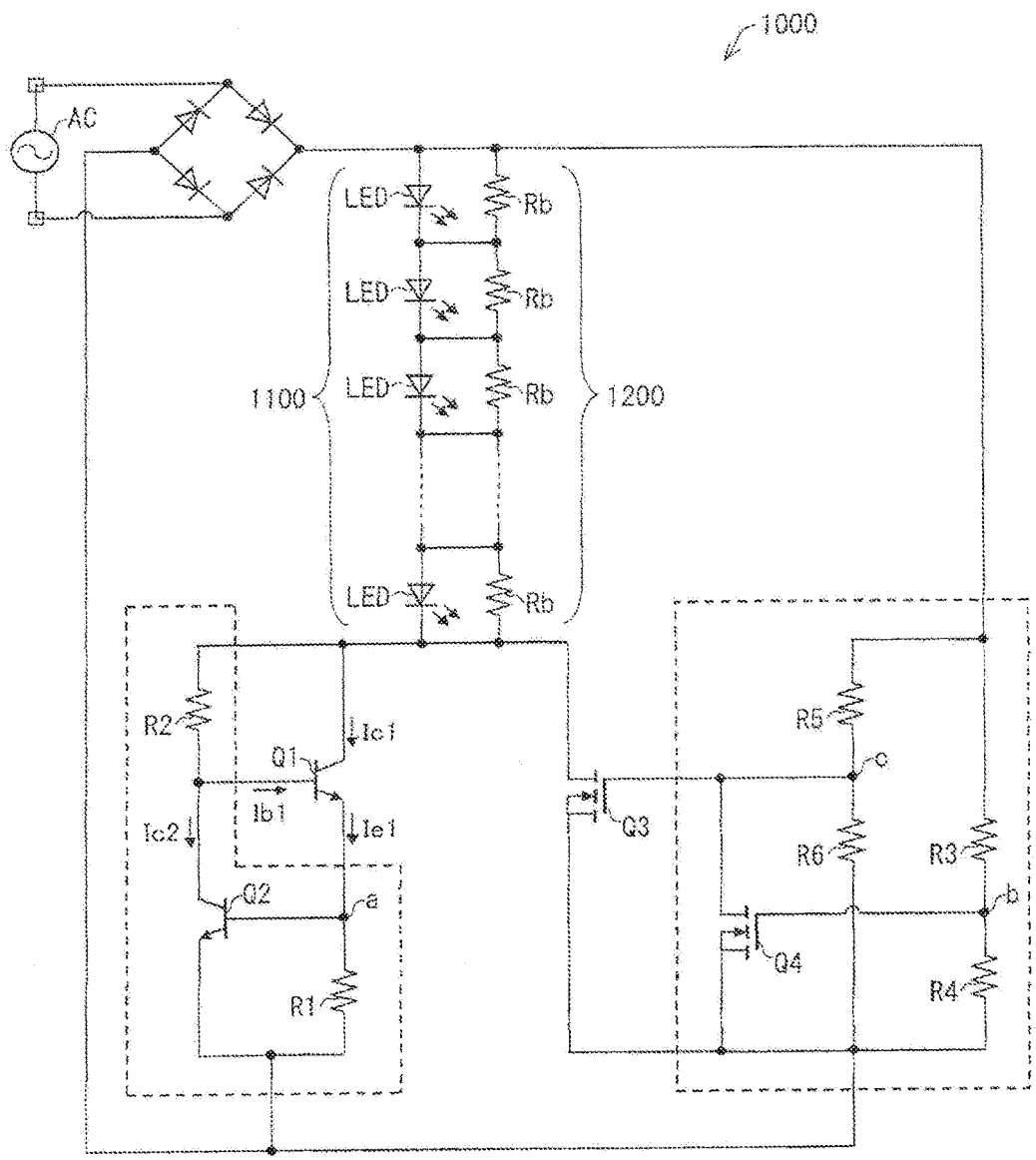
FIG. 13 is an equivalent circuit schematic illustrating a circuit configuration of a conventional light emitting device.

The following deals with a configuration of an LED electric bulb including a light emitting device according to any one of Embodiment 1 to 8, as a concrete example of the illuminating device. FIG. 12(*a*) and FIG. 12(*b*) illustrate one exemplary configuration of an LED electric bulb 900. FIG. 12(*a*) illustrates an appearance of a side face of the LED electric bulb 900. FIG. 12(*b*) illustrates a mounting surface on which a light emitting device 909 is provided.

As illustrated in FIG. 12(*a*) and FIG. 12(*b*), the LED electric bulb 900 is configured such that a base plate 904 is fixed, by screws 905, to a radiation fin 902 fastened onto a mouth ring 901, and a lens dome 903 containing a scattering material is provided so as to cover the base plate 904. The mouth ring 901 is a metal part of the electric bulb which metal part is screwed into a socket. A size of the mouth ring 901 may be preferably E26, E17, or the like. In particular, the light emitting devices according to Embodiments 1 to 8 can be produced with a small surface area, such as 15 mm×12 mm. In view of this, the size of the mouth ring 901 is preferably E17.

On the base plate 904 is provided a light emitting device 909. The light emitting device 909 is fixed by tap pins 906. As the light emitting device 909, any of the light emitting devices according to Embodiments 1 to 8 described above can be used. The light emitting device 909 includes an anode-side electrode land 103 and a cathode-side electrode land 104, which are electrically connected to external wiring lines (an anode wire connection 907 and a cathode wire connection 908).

By arranging the LED electric bulb 900 to include the light emitting device 909, it is possible to restrain luminance unevenness and to improve luminous efficiency. As a result, the LED electric bulb 900 serves as a very excellent illuminating device.

Further, it is also possible to form a planar light source in which a plurality of light emitting devices according to any one of Embodiments 1 to 8 are disposed on a housing substrate in a matrix manner. In this case, when each of the light emitting devices is provided with an external lens for adjusting a light distribution characteristic, or when a fluorescent-material-containing resin layer 109 in each of the light emitting devices is formed in a projecting shape, as illustrated in FIG. 3, so as to have a lens function, the planar light source can have a light distribution characteristic. With the configuration, it is possible to arrange a liquid crystal display device to be provided with such a planar light source as a BL (backlight) light source.

The present invention is not limited to the description of the embodiments above, but may be altered by a skilled person within the scope of the claims. An embodiment based on a proper combination of technical means disclosed in different embodiments is encompassed in the technical scope of the present invention.

A light emitting device of the present invention is a light emitting device including: a substrate; a plurality of light emitting elements provided on a primary surface of the substrate; at least one protective element connected in parallel with the plurality of light emitting element; a resin frame made of a resin having a low optical transmittance, the resin frame being provided annularly on the primary surface of the substrate so as to surround a mounting area in which the plurality of light emitting elements are provided; a fluorescent-material-containing resin layer made of a resin containing fluorescent materials, the fluorescent-material-containing resin layer being provided adjacent to an inner side of the resin frame so as to cover the plurality of light emitting elements; and at least one first light emitting element connection electrode and at least one second light emitting element connection electrode, which are provided on the primary surface of the substrate so as to face each other along a first direction in the primary surface. The light emitting device of the present invention is configured such that (i) the plurality of light emitting elements have such a circuit configuration that at least two series circuit sections, in each of which at least two of the plurality of light emitting elements are connected in series, are connected in parallel between the at least one first light emitting element connection electrode and the at least one second light emitting element connection electrode, (ii) the at least two series circuit sections are aligned along a second direction orthogonal to the first direction in the primary surface, between the at least one first light emitting element connection electrode and the at least one second light emitting element connection electrode, and (iii) the at least two of the plurality of light emitting elements in each of the at least two series circuit sections are aligned along the first direction, and (iv) the at least one first light emitting element connection electrode and the at least one second light emitting element connection electrode are disposed below at least one of the resin frame and the fluorescent-material-containing resin layer.

In the light emitting device of the present invention, it is preferable that (i) the plurality of light emitting elements be divided into a plurality of groups so that each of the plurality of groups includes a corresponding first light emitting element connection electrode and a corresponding second light emitting element connection electrode, (ii) the plurality of groups be aligned along the second direction, (iii) connection wiring lines be provided on the primary surface of the substrate so as to connect adjoining groups in series, and (iv) each of the at least one protective element be provided for each of the plurality of groups.

In the above configuration, the light emitting elements are disposed in several groups according to the number of light emitting elements and how the light emitting elements are configured. This makes it possible to minimize the mounting area in which the light emitting elements are to be provided. As a result, it is also possible to reduce an area in which to provide the first light emitting element connection electrodes, the second light emitting element connection electrodes, the resin frame, and the like. This makes it possible to downsize the light emitting device. Further, the protective element is provided for each of the groups. As a result, it is possible to minimize a decrease in light output when a series circuit section is disconnected.

In the light emitting device of the present invention, it is preferable that the resin used for forming the resin frame be colored in white or milky white. This makes it possible to set an optical transmittance of the resin used for forming the resin frame to be low, or to allow the resin used for forming the resin frame to have light reflectivity.

The light emitting device of the present invention is preferably configured such that adjoining light emitting elements in each of the at least two series circuit sections are wire-bonded to each other such that a cathode electrode of one of the adjoining light emitting elements is directly connected, via a metal wire, to an anode electrode of the other one of the adjoining light emitting elements. This makes it possible to reduce distances between light emitting elements, thereby increasing a packaging density of the light emitting elements.

The light emitting device of the present invention is preferably configured such that the at least one protective element is a thin-film printed resistor provided partially on the primary surface of the substrate, and the at least one protective element is provided on a periphery of the mounting area and below at least one of the resin frame and the fluorescent-material-containing resin layer so as to be electrically connected to the at least one first light emitting element connection electrode and the at least one second light emitting element connection electrode.

The light emitting device of the present invention is preferably configured such that the at least one protective element is at least one thin-film printed resistor each provided partially on the primary surface of the substrate, and each of the at least one protective element is provided on a periphery of the mounting area and below at least one of the resin frame and the fluorescent-material-containing resin layer so as to be electrically connected to a corresponding first light emitting element connection electrode and a corresponding second light emitting element connection electrode in a corresponding group.

With the above configuration, it is possible to easily form a resin frame, a fluorescent-material-containing resin layer, and the like on a protective element(s). Accordingly, the flexibility of a layout of the protective element(s) becomes high, thereby resulting in that the protective element(s) can be disposed near the light emitting elements or below the resin frame and the fluorescent-material-containing resin layer. Further, when a largest possible part of the protective element(s) is disposed below the resin frame so as to be covered with the resin frame, it is possible to restrain light absorption by the protective element(s) as much as possible.

In the light emitting device of the present invention, it is preferable that the substrate be a ceramic substrate made of ceramic.

The light emitting device of the present invention is preferably configured such that each of the plurality of light emitting elements includes a cathode electrode and an anode electrode, which are provided so as to face each other, and the plurality of light emitting elements are aligned in a same orientation in which the cathode electrode and the anode electrode of said each of the plurality of light emitting elements face each other along the first direction.

The light emitting device of the present invention is preferably configured such that each of the plurality of light emitting elements includes a cathode electrode and an anode electrode, which are provided so as to face each other, and the plurality of light emitting elements are aligned in a same orientation in which the cathode electrode and the anode electrode of said each of the plurality of light emitting elements face each other along the second direction.

In the above configuration, all the light emitting elements are aligned in the same orientation. Accordingly, it is possible to die-bond the light emitting elements without changing their orientation. This makes it possible to simplify a die-bond device/process. Further, in the configuration, along which direction the cathode electrode is opposite the anode direction is selected in accordance with the shape of the light emitting element. This accordingly makes it possible to preferably reduce distances between the light emitting elements, thereby increasing a packaging density of the light emitting elements as much as possible.

The light emitting device of the present invention is preferably such that the thin-film printed resistor has a resistance value of 1 MΩ to 10 GΩ.

The light emitting device of the present invention is preferably such that the resin frame has an annular shape when viewed in a plane manner. In the configuration, the fluorescent-material-containing resin layer has a circular shape when viewed in a plane manner. Accordingly, light emitted from the light emitting elements easily outputs in all direction, uniformly. Further, with the above configuration, the light emitting device can be easily applied to a general-purpose lighting apparatus, and such a general-purpose lighting apparatus to which the light emitting device is applied can be easily designed.

INDUSTRIAL APPLICABILITY

The present invention can be preferably used in a field related to a light emitting device in which a plurality of LEDs are provided on a substrate such that they are connected in a series-parallel connection. In addition to this, the present invention can be preferably used in a field related to a production method for producing a light emitting device. Furthermore, the present invention can be widely used in a field of electronics devices provided with a light emitting device.

REFERENCE SIGNS LIST

100, 200, 300, 400, 500, 600, 700, 800: Light Emitting Device
101: Ceramic Substrate (Substrate)
102: Electrode Wiring Patterns
102a/102d/102g/102j: Connection Wiring Line
102b/102e/102h: Anode-side Electrode (First Light Emitting Element Connection Electrode)
102c/102f/102i: Cathode-side Electrode (Second Light Emitting Element Connection Electrode)
103: Anode-side Electrode Land
104: Cathode-side Electrode Land
105, 105': LED chip (Light Emitting Element)
106: Wire (Metal Wire)
107, 107a to 107c: Printed Resistor (Protective Element)
108: Dam Resin (Resin Frame)
109: Fluorescent-material-containing Resin Layer
900: LED Electric Bulb
909: Light Emitting Device

The invention claimed is:

1. A light emitting device comprising:
a substrate;
a plurality of LED chips positioned around a center of a primary surface of the substrate;

a resin frame made of resin that has light reflectivity, formed on the primary surface of said substrate and provided annularly so as to surround a mounting area in which said plurality of LED chips are provided;

an anode-side electrode land and a cathode-side electrode land which are electrodes to be connected to an external voltage supply of said light emitting device, the anode-side electrode land and the cathode-side electrode land being provided outside said resin frame;

an electrode wiring pattern formed on the primary surface of said substrate including (i) an anode pattern extending from said anode-side electrode land to a portion under said resin frame and (ii) a cathode pattern extending from said cathode-side electrode land to another portion under said resin frame, so as to electrically connect the plurality of LED chips to the anode-side electrode land and the cathode-side electrode land; and a protection film provided on the anode pattern and the cathode pattern.

2. The light emitting device as set forth in claim 1, wherein said substrate has rectangular outer shape in a top view.

3. The light emitting device as set forth in claim 2, wherein:
the cathode-side electrode land is provided near a corner of the primary surface of the substrate, which corner is diagonally opposite a corner where the anode-side electrode land is provided.

4. The light emitting device as set forth in claim 2, wherein: the anode-side electrode land and the cathode-side electrode land are disposed diagonally on the primary surface of the substrate.

5. The light emitting device as set forth in claim 1, wherein the anode-side electrode land and the cathode-side electrode land are provided near corners of the primary surface of the substrate.

6. The light emitting device as set forth in claim 1, further comprising:
a fluorescent-material-containing resin layer provided so as to (i) be attached to an inner side of the resin frame and (ii) cover the plurality of LED chips.

7. The light emitting device as set forth in claim 6 wherein:
the fluorescent-material-containing resin layer is provided along a shape of the resin frame so as to have a circular shape in the top view.

8. The light emitting device as set forth in claim 1, wherein each of said anode-side electrode land and said cathode-side electrode land has a width larger than that of said electrode wiring pattern.

9. The light emitting device as set forth in claim 1, wherein said substrate comprises ceramic.

10. The light emitting device as set forth in claim 1, wherein said LED chips are attached to the primary surface of said substrate via a resin adhesive agent comprising silicone.

11. The light emitting device as set forth in claim 1, wherein said anode pattern further extends to the mounting area.

12. The light emitting device as set forth in claim 1, wherein said cathode pattern further extends to the mounting area.

13. The light emitting device as set forth in claim 1, wherein:
the protection film includes a first protection film and a second protection film; and
the first protection film and the second protection film are provided on the anode pattern and the cathode pattern, respectively.

14. The light emitting device as set forth in claim 13, wherein at least part of the first protection film and at least part of the second protection film are provided so as to be exposed without being covered with the resin frame.

* * * * *